(12) United States Patent  (10) Patent No.: US 8,405,221 B2
Imai  (45) Date of Patent: Mar. 26, 2013

(54) SEMICONDUCTOR DEVICE AND MULTILAYER SEMICONDUCTOR DEVICE

(75) Inventor: Makoto Imai, Tokyo (JP)

(73) Assignee: Sony Corporation, Tokyo (JP)

( * ) Notice: Subject to any disclaimer, the term of this patent is extended or adjusted under 35 U.S.C. 154(b) by 13 days.

(21) Appl. No.: 13/067,660

(22) Filed: Jun. 17, 2011

(65) Prior Publication Data

US 2012/0025391 A1  Feb. 2, 2012

(30) Foreign Application Priority Data

Jul. 29, 2010 (JP) ................................. 2010-170815

(51) Int. Cl.
*H01L 23/48* (2006.01)

(52) U.S. Cl. . 257/773; 257/686; 257/777; 257/E25.006; 257/E25.013; 257/E25.021; 257/E25.027; 257/E23.085

(58) Field of Classification Search .................. 257/723, 257/773, 777, E25.006, E25.013, E25.021, 257/E25.027, E23.085, 686, E25.005; 438/109, 438/FOR. 368, FOR. 426
See application file for complete search history.

(56) References Cited

U.S. PATENT DOCUMENTS 7,046,522 B2 * 5/2006 Sung et al. ..................... 361/803
7,564,127 B2 * 7/2009 Ikeda et al. .................... 257/686
7,791,918 B2 * 9/2010 Ruby .............................. 365/51

FOREIGN PATENT DOCUMENTS

| JP | 07-283375 | 10/1995 |
|---|---|---|
| JP | 2003-110086 | 4/2003 |
| JP | 2005-025864 | 1/2005 |
| JP | 2005-122823 | 5/2005 |
| JP | 2006-190840 | 7/2006 |
| JP | 2007-157266 | 6/2007 |
| JP | 2009-147088 | 7/2009 |

* cited by examiner

*Primary Examiner* — Jasmine Clark
(74) *Attorney, Agent, or Firm* — Rader, Fishman & Grauer PLLC

(57) ABSTRACT

Disclosed herein is a semiconductor device including: an input terminal receiving, if a preceding-stage semiconductor device is layered on a predetermined one of an upper layer and a lower layer, a bit train outputted from the preceding-stage semiconductor device; a semiconductor device identifier hold block holding a semiconductor device identifier for uniquely identifying the semiconductor device; a semiconductor device identifier computation block executing computation by using the semiconductor device identifier to update the semiconductor device identifier held in the semiconductor device identifier hold block according to a result of the computation; a control block once holding data of a bit train entered from the input terminal to control updating of the semiconductor device identifier executed by the semiconductor device identifier computation block based on the held data; and an output terminal outputting the bit train held in the control block to a succeeding-stage semiconductor device layered on another layer.

15 Claims, 12 Drawing Sheets

F I G . 3
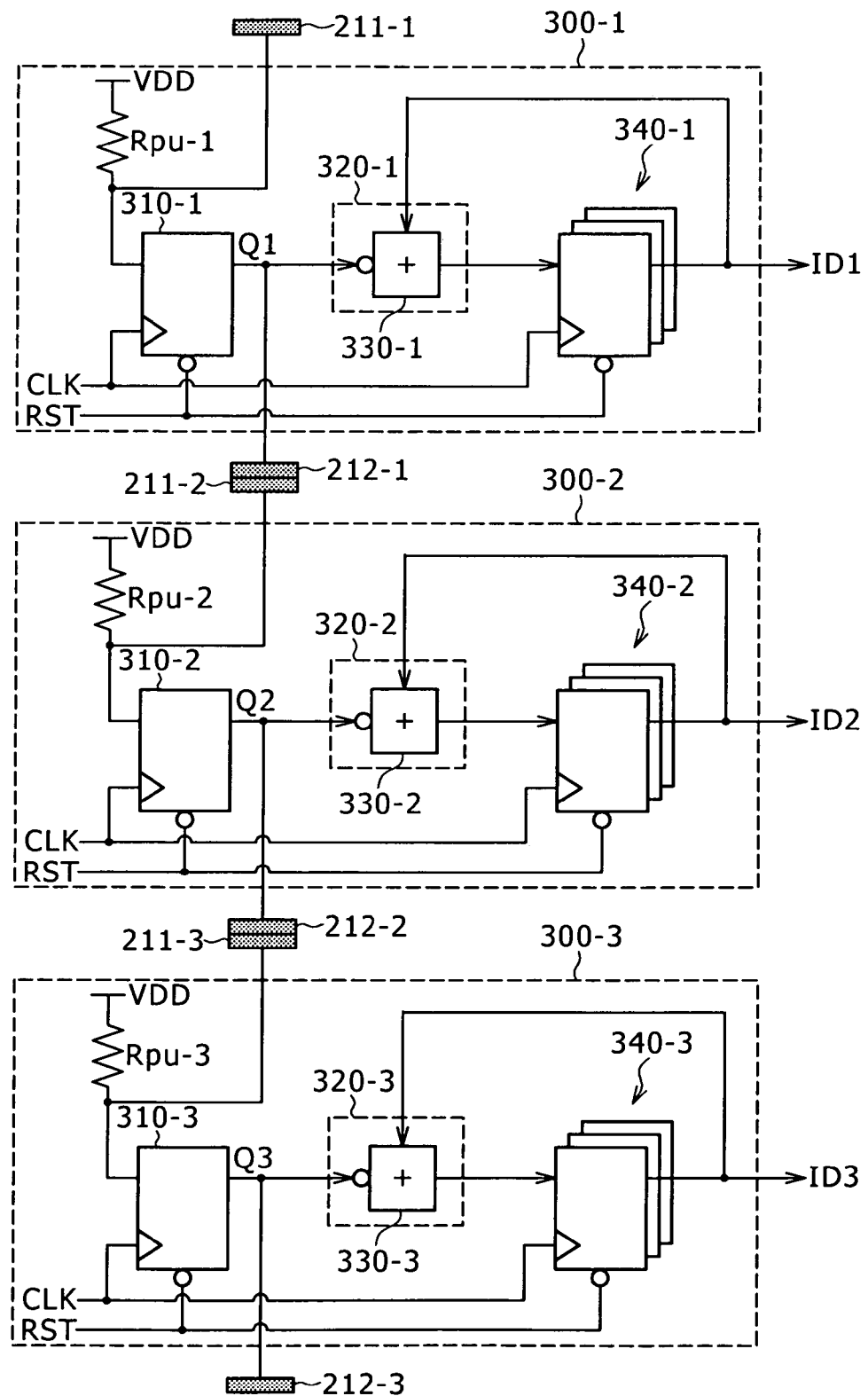

SEMICONDUCTOR DEVICE AND MULTILAYER SEMICONDUCTOR DEVICE

BACKGROUND

The present disclosure relates to a semiconductor device and, more particularly, to a semiconductor device in which a semiconductor identifier is set after layering in a multilayer semiconductor device and a multilayer semiconductor device formed by layering two or more such semiconductor devices.

For an integrated semiconductor device, a multilayer semiconductor device formed by layering two or more semiconductor chips for three-dimensional configuration is known. The semiconductor chips layered in such a multilayer semiconductor device are interconnected with common wiring, such as a bus, for example. This common wiring is hereafter referred to also as global wiring.

When global wiring is employed, control signals generated by a logic and the like are simultaneously transmitted to two or more semiconductor chips via global wiring. Therefore, selective access to one specific semiconductor chip requires for this semiconductor chip to recognize whether or not a signal outputted from the logic and the like is addressed to this semiconductor chip for each multilayer semiconductor chip. Accordingly, the semiconductor chip concerned is able to operate in accordance with a signal addressed to this semiconductor chip. If a signal is found not addressed to the semiconductor chip, this semiconductor chip is able to operate not to respond such a signal.

Therefore, in order to allow the selective control of each semiconductor chip, a technique is in use in which a chip identifier is allocated to each of the chips that are layered. This facilitates the construction of a mechanism for controlling only particular semiconductor chips by specifying their chip identifiers.

For the above-mentioned chip identifier allocation, a related-art technology is known in which a chip identifier is held in a nonvolatile memory or a member equivalent thereto in each semiconductor chip (see Japanese Patent Laid-open No. 2003-110086 (FIG. 3) referred to as Patent Document 1 hereinafter and Japanese Patent Laid-open No. Hei 7-283375 (FIG. 2) referred to as Patent Document 2 hereinafter, for example).

In another related-art technology, a chip identifier is set by wiring predetermined two or more terminals to power or ground at the time of package assembly (see Japanese Patent Laid-open No. 2005-25864 (FIG. 3) referred to as Patent Document 3, for example).

In still another related-art technology, a chip identifier is set in accordance with the fluctuation or each semiconductor chip or the fluctuation of a particular characteristic (see Japanese Patent Laid-open No. 2006-190840 (FIG. 2), Japanese Patent Laid-open No. 2009-147088 (FIG. 1), Japanese Patent Laid-open No. 2005-122823 (FIG. 3), referred to as Patent Documents 4 to 6, for example).

In yet another related-art technology, an increment circuit arranged for each semiconductor chip is sequentially connected with other increment circuits in series arranged in other semiconductor chips (see Japanese Patent Laid-open No. 2007-157266 (FIG. 2) referred to as Patent Document 7, for example). This related-art technology allows the automatic setting of chip identifiers from "0" sequentially for the layered semiconductor chips.

SUMMARY

However, with the first and second technologies mentioned above, the setting of chip identifiers requires data writing and wiring for each semiconductor chip at the stage of manufacturing. The third technology mentioned above includes a technique that can automatically set chip identifiers by an internal circuit, but, because chip identifiers are determined depending on an uncertain reason, namely, variations in manufacturing, cannot always guarantee the setting of the chip identifiers that are unique to different semiconductor chips. In addition, this technology may not allocate consecutively numbered chip identifiers to different semiconductor chips. Therefore, a circuit of reading the chip identifiers of semiconductor chips by a controller for example has to be added, thereby complicating the circuit configuration.

The fourth technology mentioned above need not set chip identifiers at the stage of manufacturing. This technology also can surely allocate consecutively numbered chip identifiers to semiconductor chips. However, this fourth technology requires at least the number of wires corresponding to the number of bits by which a maximum value of the number of chip identifiers to be allocated between the increment circuits. These wires are laid between the layers of each semiconductor chip. Therefore, the number of joint terminals and the locations thereof corresponding to these wires have to be made common to all semiconductor chips. This can be achieved if the chips to be layered for example have each the same construction manufactured by the same process. However, if the semiconductor chips have different structures, achieving the commonality of the number of wires in correspondence with the setting of chip identifiers requires the sufficient consideration of the setting of the positional relationships with other wires, for example, thereby making it difficult to implement this technology. This problem becomes more conspicuous as the number of wires between the increment circuits increases in correspondence with the increase in the number of semiconductor chips to be layered.

Therefore, the present disclosure addresses the above-identified and other problems associated with related-art methods and apparatuses and solves the addressed problems by providing a semiconductor device and a multilayer semiconductor device that are configured to reduce, in the allocation of chip identifiers to semiconductor devices to be layered in a multilayer semiconductor device, the number of wires to be laid between the semiconductor chips to be made common in correspondence with the setting of the chip identifiers.

In carrying out the disclosure and according to a first embodiment thereof, there is provided a semiconductor device. This semiconductor device has an input terminal configured, if a preceding-stage semiconductor device is layered on a predetermined one of an upper layer and a lower layer, to receive a bit train outputted from the preceding-stage semiconductor device; a semiconductor device identifier hold block configured to hold a semiconductor device identifier for uniquely identifying the semiconductor device; a semiconductor device identifier computation block configured to execute computation by use of the semiconductor device identifier to update the semiconductor device identifier held in the semiconductor device identifier hold block in accordance with a result of the computation; a control block configured to once hold data of a bit train entered from the input terminal to control updating of the semiconductor device identifier executed by the semiconductor device identifier computation block on the basis of the held data; and an output terminal configured to output the bit train held in the control block to a succeeding-stage semiconductor device layered on another layer.

In the first embodiment of the disclosure, the control block may control the execution of the updating of the semiconductor device identifier in accordance with the held data. Consequently, by stopping the subsequent updating with a timing updated to a value of a corresponding semiconductor device identifier, the semiconductor device identifier can be established.

In the first embodiment of the disclosure, if a value of the held data is a predetermined prohibition instruction value, then the control block prohibits the updating of the semiconductor device identifier and, if a value of the held data is not the predetermined prohibition instruction value, then allows the updating of the semiconductor device identifier. Consequently, by holding predetermined value data in the control block, the updating of the above-mentioned semiconductor device identifier can be disabled.

In the first embodiment of the disclosure, the control block holds and sequentially shifts a bit train of semiconductor device associated data indicating predetermined contents of information associated with a semiconductor device in which the information is entered and executes the updating of the semiconductor device identifier in accordance with a timing at which the held semiconductor device associated data have all been shifted out. Consequently, when the control block holds the semiconductor device associated data, the control block updates the semiconductor device identifier and transmits the held semiconductor device associated data to a succeeding-stage semiconductor device.

In the first embodiment of the disclosure, the control block executes the updating of the semiconductor device identifier in accordance with a timing at which a shift count according to a bit length of the semiconductor device associated data based on a fixed length has been counted. Consequently, the updating of semiconductor device identifiers is executed every time a bit train of entire semiconductor device associated data based on fixed length is shifted out.

In the first embodiment of the disclosure, the semiconductor device associated data is made up of a real data part based on a given data length and a data length part based on a fixed length and the control block executes the updating of the semiconductor identifier in accordance with a timing at which a bit train having a bit length indicated by the held data length part has been shifted out. Consequently, the updating of semiconductor device identifiers is executed every time the control block sequentially shifts out the entire semiconductor device associated data of variable length.

In the first embodiment of the disclosure, the control block executes the updating of the semiconductor device identifier in accordance with the computation result obtained by adding a constant value to the semiconductor device identifier. Consequently, a semiconductor device identifier based on a value at certain intervals is set for each layered semiconductor device.

In the first embodiment of the disclosure, the control block executes the updating of the semiconductor device identifier in accordance with the computation result obtained by use of the held data and the semiconductor device identifier. Consequently, a semiconductor device identifier not based on a value at certain intervals is set for each layered semiconductor device.

In the first embodiment of the disclosure, the control block gets addition value data to be added to the semiconductor device identifier from the input terminal to hold the obtained addition value data and executes the updating of the semiconductor device identifier in accordance with the computation result obtained by adding a value of the held addition value data to the semiconductor device identifier. Consequently, a semiconductor device identifier based on a value obtained by sequentially accumulating added value data is set for each layered semiconductor device.

In the first embodiment of the disclosure, the value of the addition value data indicates the number of storage blocks of a corresponding semiconductor device. Consequently, an offset address corresponding to a storage block of each layered semiconductor device is set as a semiconductor device identifier.

In the first embodiment of the disclosure, a fixed value input block is further arranged through which bits based on a fixed value are entered into the control block if no bit train is entered from the input terminal, the prohibition instruction value being a value obtained when each bit of the held data is the fixed value. Consequently, the updating of semiconductor device identifiers is stopped by a prohibition instruction value of a bit train based on a predetermined fixed value.

In the first embodiment of the disclosure, the fixed value input block is a pullup resistor inserted between a signal line based on positive supply voltage and an input of the control block. Consequently, a prohibition instruction value based on "1" bit arrangement is generated.

In the first embodiment of the disclosure, the fixed value input block is a pulldown resistor inserted between ground signal line and an input of the control block. Consequently, a prohibition instruction value based on "0" bit arrangement is generated.

In carrying out the disclosure and according to a second embodiment thereof, there is provided a multilayer semiconductor device. This multilayer semiconductor device has a plurality of layered semiconductor devices; and a storage device that is layered on the plurality of layered semiconductor devices. In this configuration, each of the plurality of layered semiconductor devices has an input terminal configured, by being connected to an output terminal of another semiconductor device layered on one of an upper layer and a lower layer, to receive a bit train outputted from the connected output terminal, a semiconductor device identifier hold block configured to hold a semiconductor device identifier for uniquely identifying the semiconductor device, a semiconductor device identifier computation block configured to execute computation by use of the semiconductor device identifier to update the semiconductor device identifier held in the semiconductor device identifier hold block in accordance with a result of the computation, a control block configured to once hold data of a bit train inputted from the input terminal to control the updating of the semiconductor device identifier executed by the semiconductor device identifier computation block on the basis of the held data, the controlling block receiving a bit train of semiconductor device associated data indicative of contents of predetermined information associated with a semiconductor device from the input terminal, and an output terminal configured, by being connected to an input terminal of still another semiconductor device layered on another layer, to output a bit train held in the control block to the connected input terminal. The storage device has a semiconductor device associated data storage block configured to receive a bit train outputted from the output terminal of a final stage semiconductor device in the layered semiconductor device to store semiconductor device associated data in the received bit train. Consequently, a semiconductor identifier is set for each layered semiconductor device and semiconductor device associated data is stored in the final-stage storage device in the layered structure.

In carrying out the disclosure and according to a third embodiment thereof, there is provided a multilayer semiconductor device. This multilayer semiconductor device has a plurality of layered semiconductor devices. In this plurality of layered semiconductor devices, each of the plurality of semiconductor devices has an input terminal configured, by being connected to an output terminal of another semiconductor device layered on one of an upper layer and a lower layer, to receive a bit train outputted from the connected output terminal, a semiconductor device identifier hold block configured to hold a semiconductor device identifier for uniquely identifying the semiconductor device, a semiconductor device identifier computation block configured to execute computation by use of the semiconductor device identifier to update the semiconductor device identifier held in the semiconductor device identifier hold block in accordance with a result of the computation, a control block configured to once hold data of a bit train inputted from the input terminal to control the updating of the semiconductor device identifier executed by the semiconductor device identifier computation block on the basis of the held data and hold semiconductor device associated data indicating contents of predetermined information associated with a semiconductor device as an initial value, and an output terminal configured, by being connected to an input terminal of another semiconductor device layered on another layer, to output a bit train held in the control block to the connected input terminal. Consequently, a semiconductor device identifier is set for each layered semiconductor device and a bit train of data held by the control block for updating the semiconductor device identifier is transmitted to the control block of the succeeding-stage semiconductor device via terminal connections.

As described above and according to the embodiments of the disclosure, excellent effects are provided that the number of wires of semiconductor chips to be made common for the setting of chip identifiers can be reduced to one.

BRIEF DESCRIPTION OF THE DRAWINGS

FIG. 3 is a schematic diagram illustrating another exemplary configuration of the chip identifier setting block in the first embodiment of the disclosure;

DETAILED DESCRIPTION OF THE PREFERRED EMBODIMENTS

This disclosure will be described in further detail by way of embodiments thereof with reference to the accompanying drawings.

The description will be made in the following order:

(1) First embodiment (setting of chip identifiers: an example of setting chip identifiers from "1" in the ascending order);

(2) Second embodiment (setting of chip identifiers: an example in which chip identifiers are set and information about each chip is outputted to the outside);

(3) Third embodiment (setting of chip identifiers: an example of setting the offset address of a memory plane for each chip as the chip identifier thereof); and (4) Fourth embodiment (setting of chip identifiers: an example in which chip identifiers are set and variable-length information for each chip is outputted to the outside).

(1) First Embodiment

An Overall Configuration of a Multilayer Semiconductor Device

Figure 1:
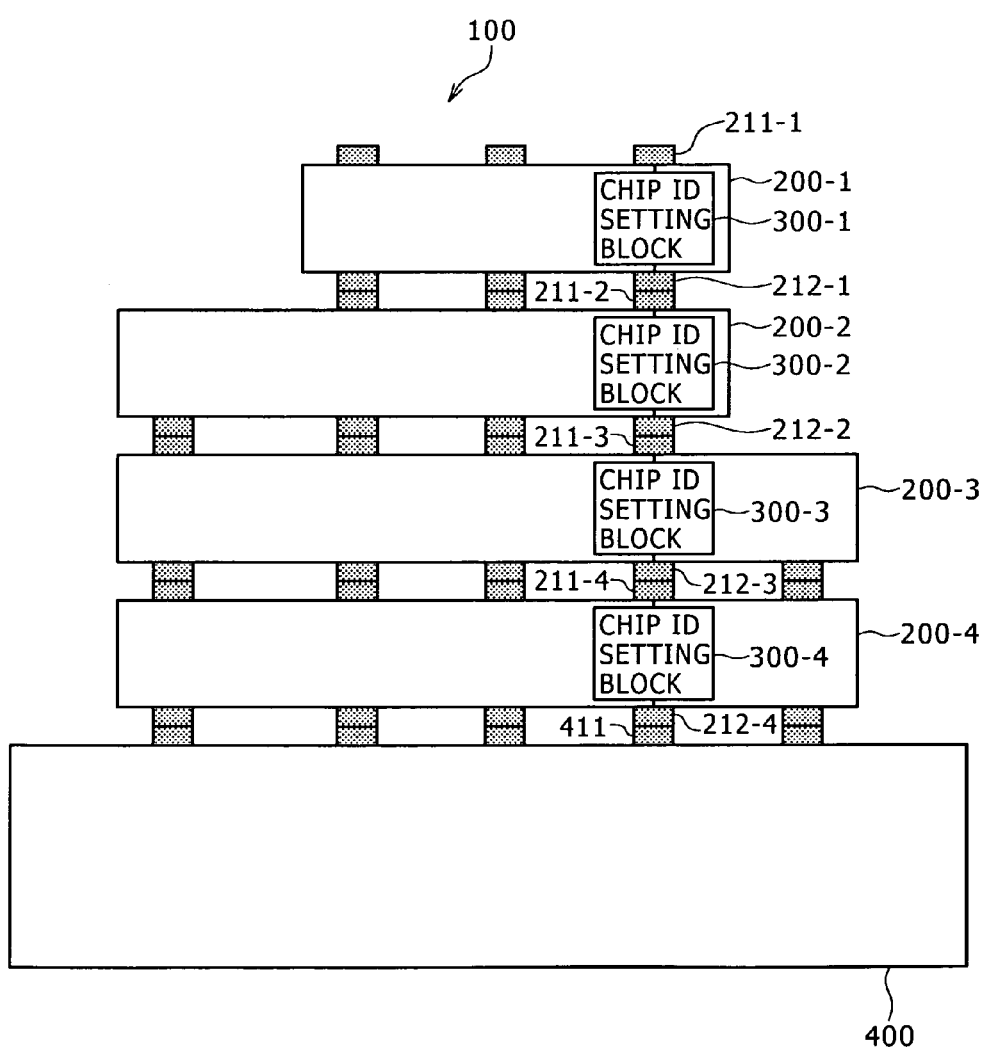
FIG. 1 is a schematic diagram illustrating an exemplary structure of a multilayer semiconductor device practiced as one embodiment of the disclosure.

Now, referring to FIG. 1, there is shown an exemplary configuration of a multilayer semiconductor device 100 practiced as the first embodiment of the disclosure. The multilayer semiconductor device 100 shown in the figure has a structure in which chips 200-1, 200-2, 200-3, and 200-4 and a base chip 400 are layered from top to bottom in this order. The chips 200-1 to 200-4 are semiconductor chips each having a predetermined function. It should be noted that the chips 200-1 to 200-4 have not especially a common structure; namely, these chips have different structures in accordance with the functions assigned thereto.

The base chip 400 is arranged at the bottom of the multilayer semiconductor device 100. Signals for controlling the chips 200-1 to 200-4 are outputted from the base chip 400 for example to be transmitted to the chips 200-1 to 200-4 via predetermined wires between the chip layers, for example. It should be noted that the base chip 400 may actually be implemented by a logic or an interposer that is a wiring board, for example.

The chips 200-1 to 200-4 according to the present embodiment internally have chip identifier setting blocks 300-1 to 300-4, respectively. The chip identifier setting block 300 automatically sets and holds a chip identifier to the corresponding chip 200. It should be noted that the chip identifier is one example of a semiconductor identifier cited in the scope of claims herein.

As shown, the chip identifier setting block 300-1 is connected to an upper electrode 211-1 and a lower electrode 212-1 formed on the upper surface and the lower surface of the chip 200-1, respectively. Likewise, the chip identifier setting blocks 300-2 to 300-4 are connected to upper electrodes 211-2 to 211-4 and lower electrodes 212-2 to 212-4 formed on the upper surfaces and the lower surfaces of the chips 200-2 to 200-4, respectively.

Between each of the layers in the chips 200-1 to 200-4, the lower electrode 212 and the upper electrode 211 are joined with each other. Consequently, the chip identifier setting blocks 300-1 to 300-4 are connected sequentially interconnected in series via the inter-layer connection.

Although not shown, a chip identifier setting blocks may be arranged on the base chip 400. In this arrangement, a lower electrode 212-4 of the chip 200-4 is joined with an upper electrode 411 of the base chip 400 to connect the base chip 400 to the chip identifier setting block 300-4 in series.

Exemplary Configuration of the Chip Identifier Setting Block

Figure 2:
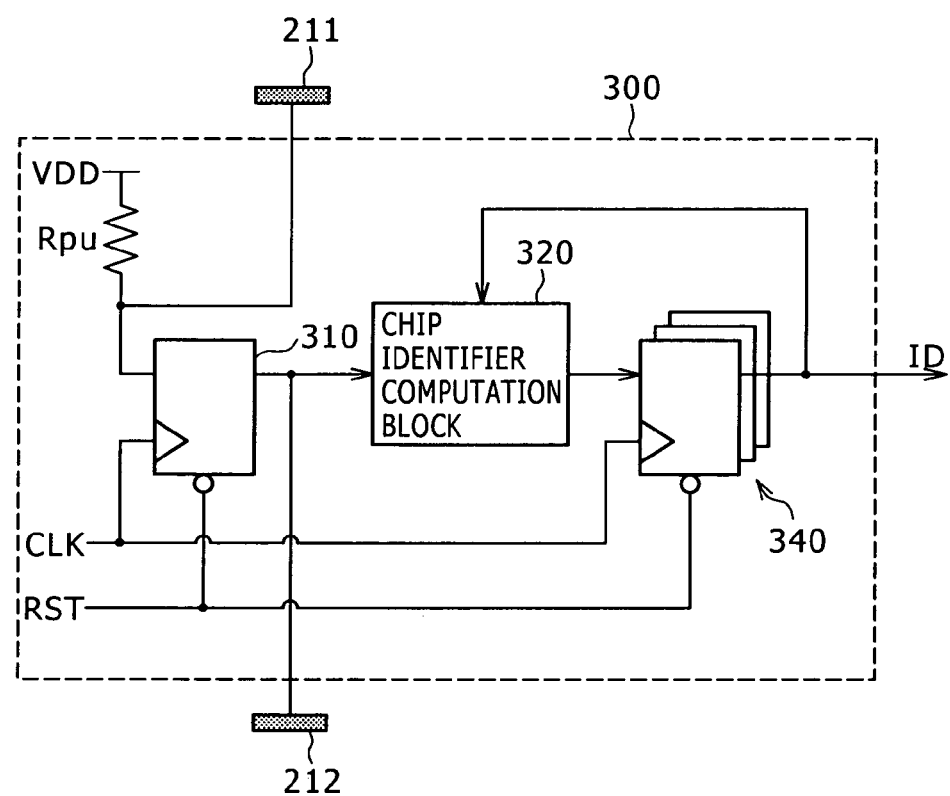
FIG. 2 is a schematic diagram illustrating an exemplary configuration of a chip identifier setting block in a first embodiment of the disclosure.

Referring to FIG. 2, there is shown an exemplary configuration of the chip identifier setting block 300 in the first embodiment of the present disclosure. The chip identifier setting block 300 shown in the figure has a shift register block 310, a chip identifier computation block 320, a chip identifier hold block 340, and a pullup resistor Rpu.

The shift register block 310 receives data entered from the upper electrode 211 and shifts the entered data in synchronization with clock CLK to output the shifted data. The shift register block 310 shown in this figure is made up of one flip-flop. Namely, the shift register block 310 is configured as a one-bit shift register. An output of the shift register block 310 is supplied to the chip identifier computation block 320 and the lower electrode 212. The shift register block 310 is one example of a control block cited in the scope of claims herein.

The pullup resistor Rpu is inserted between the input terminal of the shift register block 310 and the supply voltage VDD. If the chip identifier setting block 300 shown in this figure is of the chip 200 on the top layer, the upper electrode 211 is open and therefore no data is entered. Therefore, fixing the input terminal of the shift register block 310 to the supply voltage VDD by the pullup resistor Rpu, a signal equivalent to "1" is entered in the shift register block 310 in a fixed manner. The pullup resistor Rpu is one example of a fixed value input block cited in the scope of claims herein.

The chip identifier computation block 320 computes a value to be set as a chip identifier by a predetermined computation in accordance with the output of the shift register block 310. The chip identifier computation block 320 is one example of a semiconductor device identifier computation block cited in the scope of claim herein.

The chip identifier hold block 340 receives and holds a value computed by the chip identifier computation block 320 with a timing synchronized with clock CLK. The chip identifier hold block 340 outputs the value held as described above as a chip identifier ID set by the chip identifier setting block 300. It should be noted that the chip identifier computation block 320 and the chip identifier hold block 340 are configured to reset the value held by a reset signal RST. The chip identifier hold block 340 is one example of a semiconductor device identifier hold block cited in the scope of claims herein.

In response to the specification of the chip identifier ID from the base chip 400 for example, the chip 200 compares this specified chip identifier ID with the chip identifier ID set as above. If a match is found, the chip 200 executes an operation under the control of the base chip 400. On the other hand, if a mismatch is found, the chip 200 does not execute any operation under the control of the base chip 400. Thus, setting an individual chip identifier ID to each chip 200 allows the chip 200 to respond the control directed to the chip 200 itself by the base chip 400 and not to respond the control directed to the other chips 200.

Referring to FIG. 3, there is shown the chip identifier setting blocks 300-1 to 300-3 as extracted from the layered structure of the chips 200-1 to 200-3. It should be noted that, in FIG. 1, four chips, chips 200-1 to 200-4 are shown; however, in FIG. 3, for the convenience of description, it is assumed that the multilayer semiconductor device 100 be configured by the chips 200-1 to 200-3 and the base chip 400. Therefore, the chip identifier setting blocks 300-1 to 300-3 are shown in FIG. 3.

In the first embodiment of the disclosure, the chip identifier setting blocks 300-1 to 300-3 each have a common structure shown in FIG. 2. In this configuration, the chip identifier setting block 300-1 and the chip identifier setting block 300-2 are connected to each other via the connecting portion between the lower electrode 212-1 and the upper electrode 211-2. Likewise, the chip identifier setting block 300-2 and the chip identifier setting block 300-3 are connected to each other via connecting portion between the lower electrode 212-2 and the upper electrode 211-3.

Further, in the first embodiment of the disclosure, the chip identifier computation block 320 is configured by an adder 330. The adder 330 increments a value outputted from the chip identifier hold block 340 when an output of the shift register block 310 is "0." Namely, the adder 330 is configured to add "1" as a constant value to the value of the chip identifier ID of this case. It should be noted that a specific exemplary configuration of the adder 330 will be described with reference to FIG. 5 along with a specific exemplary configuration of the chip identifier hold block 340. Exemplary setting operation of the chip identifier Referring to FIG. 4, there is shown a timing chart indicative of an operation of setting a chip identifier ID by each of the chip identifier setting blocks 300-1 to 300-3 shown in FIG. 3.

First, before time t0, a reset signal RST is at "L" level. In response to "L" level of the reset signal RST, the shift register blocks 310-1 to 310-3 initializes output data Q1, Q2, and Q3, respectively, to "0." Likewise, in response to "L" of the reset signal RST, the chip identifier hold blocks 340-1 to 340-3 initializes chip identifiers ID1, ID2, and ID3, respectively, to "0" as outputs thereof.

Next, when the reset signal RST goes "H" level at time t0, the shift register blocks 310-1 to 310-3 become ready for shifting the input data. It should be noted that, because no clock CLK is entered in a period between time t0 and time t1, output data Q1, Q2, and Q3 remain at "0" until time t1 is reached. Likewise, chip identifiers ID1, ID2, and ID3 remain at "0" before time t0. Further, before time t1, because chip identifiers ID1, ID2, and ID3 are "0," the adders 330-1 to 330-3 are each in a state in which each "1" is outputted by the increment from "0."

Then, it is assumed that the input of clock CLK started at time t1 at which the clock CLK rises as shown. At this moment, "1" is entered at the input terminal of the shift register block 310-1 because the shift register block 310-1 fixed to the potential of supply voltage VDD by the pullup resistor Rpu. Consequently, output data Q1 of the shift register block 310-1 is inverted to "1" in synchronization with clock CLK at time t1.

Also, when clock CLK rises at time t1, the chip identifier hold blocks 340-1 to 340-3 capture "1" outputted from the adders 330-1 to 330-3 to hold new chip identifiers ID1, ID2, and ID3. Consequently, as shown as time t1 in FIG. 4, chip identifiers ID1, ID2, and ID3 each change from "0" to "1."

When output data Q1 of the shift register block 310-1 gets "1" at time t1, the adder 330-1 stops subsequent increment operations. Consequently, the chip identifier hold block 340-1 continues holding chip identifier ID1 of "1" at time t1 and on.

Subsequent to time t1, output data Q1 of "1" is applied from the shift register block 310-1 to the input terminal of the shift register block 310-2. Hence, at the rising of the next clock CLK shown as time t2, the shift register block 310-2 inverts output data Q2 from "0" to "1."

In addition, the adder 330-2 outputs "2" obtained by incrementing chip identifier ID2 that is "1" at time t1. Hence, when clock CLK rises at time t2, the chip identifier hold block 340-2 holds "2" outputted from the adder 330-2 and outputs "2" as chip identifier ID2. When output data Q2 of the shift register block 310-2 becomes "1" after time t2, the adder 330-2 stops the subsequent increment of the chip identifier ID2. Consequently, subsequent to time t2, the chip identifier hold block 340-2 continues to hold the chip identifier ID2 of "2."

Next, when clock CLK rises at the next rising time shown as time t3, output data Q3 of the shift register block 310-3 changes from "0" to "1." Further, because the adder 330-3 outputted "3" by incrementing chip identifier ID3 that had become "2" at time t2, the chip identifier hold block 340-2 outputs chip identifier ID3 of "3" at time t3. Then, when output data Q3 of the shift register block 310-3 becomes "1" after time t3, the adder 330-3 stops incrementing chip identifier ID3. Consequently, after time t3, the chip identifier hold block 340-3 continues to hold chip identifier ID3 of "3."

As described above, the shift register blocks 310-1 to 310-3 each one bit operate such that output data Q1, Q2, and Q3 thereof are sequentially fixed to "1" for every one period of clock CLK. To be more specific, the shift register blocks 310-1 to 310-3 each shift-output initial value "0" and sequentially transition to a state in which fixed value "1" to be entered in the shift register block 310-1 is continuously held. Consequently, in the adders 330-1 to 330-3, the timing of stopping the operation of incrementing chip identifier ID1, ID2, and ID3 is shifted by one clock period. As a result, in the configuration shown in FIG. 3, "1," "2," and "3" are set as chip identifiers ID1, ID2, and ID3, respectively. Namely, the chip identifiers IDs can be set such that, in the multilayer semiconductor device, the chip identifiers ID are incremented from "1" from the chip 200 of the top layer to the chip 200 of the bottom layer.

Specific Exemplary Configuration of the Chip Identifier Setting Block

Figure 4:
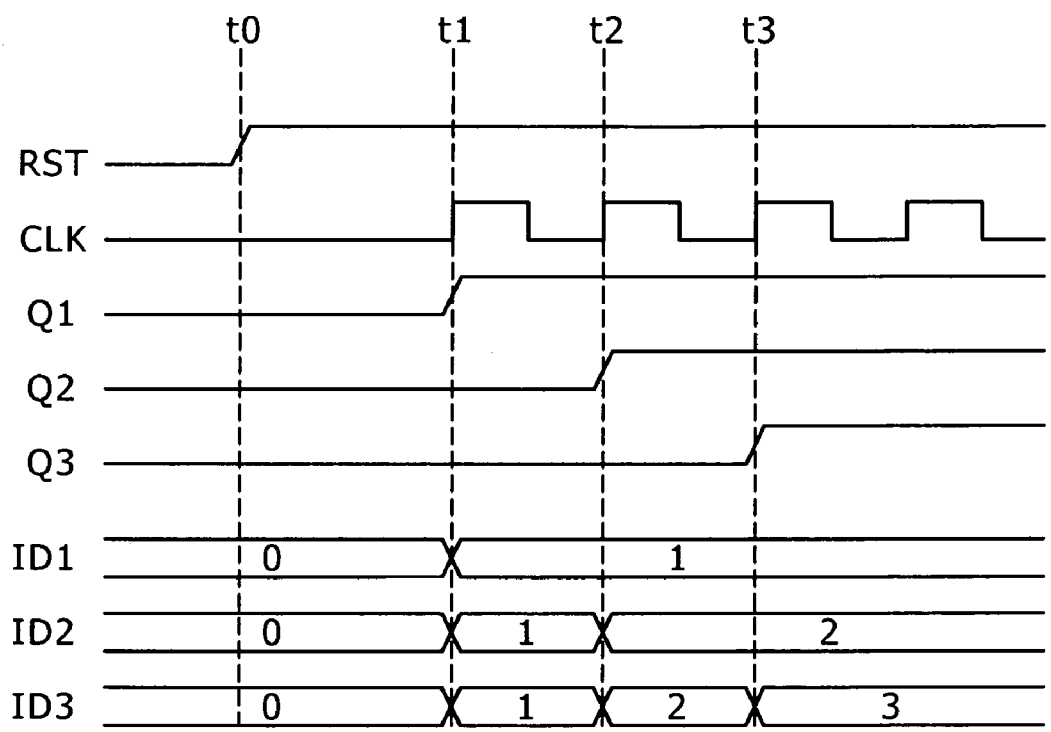
FIG. 4 is a timing chart indicative of an exemplary operation of the chip identifier setting block in the first embodiment of the disclosure.
Figure 5:
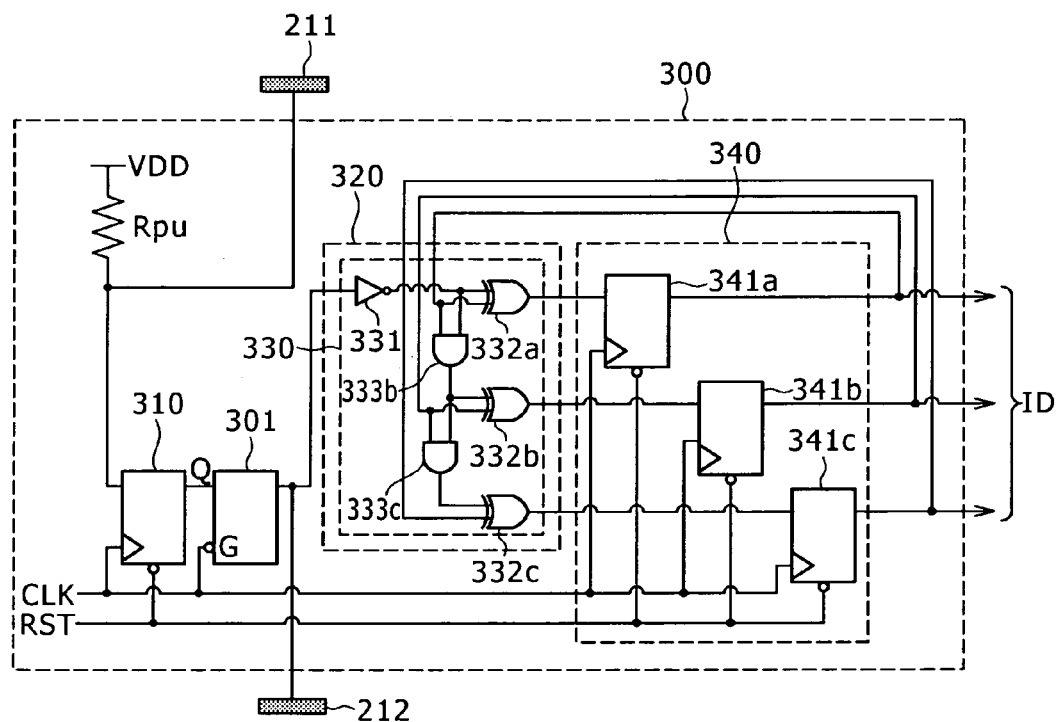
FIG. 5 is a schematic diagram illustrating a specific exemplary configuration of the a chip identifier setting block in the first embodiment of the disclosure.

Referring to FIG. 5, there is shown a specific exemplary configuration of the chip identifier setting block 300 shown in FIG. 3. To be more specific, FIG. 5 shows an specific exemplary configuration of the chip identifier setting block 300 configured to execute the operation described with reference to the timing chart shown in FIG. 4. It should be noted that, referring to FIG. 5, components similar to those previously described with reference to the chip identifier setting block 300 shown in FIG. 3 are denoted by the same reference numerals and the description of the similar components will be skipped.

With the chip identifier setting block 300 shown in FIG. 5, a latch circuit 301 is added to the configuration shown in FIG. 3. Output data Q of a shift register block 310 is outputted to a chip identifier computation block 320 and a lower electrode 212 via the latch circuit 301. Thus, arranging the latch circuit 301 to shift the signal change of data signal relative to clock CLK by half a period, for example, ensures the hold time to provide a stable operation.

Referring to FIG. 5, there is shown exemplary configurations of an adder 330 in the chip identifier computation block 320 and a chip identifier hold block 340. It should be noted that the configurations of the adder 330 and the chip identifier hold block 340 corresponding to the case in which chip identifier ID is three bits.

The adder 330 in FIG. 5 has an inverter 331, exclusive OR gates 332a to 332c, and AND gates 333b and 333c. The chip identifier hold block 340 has three flip-flops 341a to 341c.

In the adder 330, the inverter 331 inverts output data Q received via the latch circuit 301 and outputs inverted output data Q. The exclusive OR gate 332a outputs a value obtained by executing an exclusive OR operation between the output of the inverter 331 and the output of the flip-flop 341a.

The exclusive OR gate 332b outputs a value obtained by executing an exclusive OR operation between the output of the flip-flop 341b and the AND gate 333b. The AND gate 333b outputs a value obtained by executing an AND operation between the output of the inverter 331 and the output of the flip-flop 341a.

The exclusive OR gate 332c outputs a value obtained by executing an exclusive OR operation between the output of the flip-flop 341c and the AND gate 333c. The AND gate 333c outputs a value obtained by executing an AND operation between the output of the AND gate 333b and the output of the flip-flop 341b.

The adder 330 outputs a computed value of three bits. The three bits of this computed value are output data from the exclusive OR gates 332a, 332b, and 332c in this order, corresponding to the bit sequence from the least significant bit (LSB) to the most significant bit (MSB).

In the chip identifier hold block 340, clock CLK is commonly applied to the clock terminals of the flip-flops 341a to 341c. In addition, reset signal RST is commonly applied to the reset terminals of the flip-flops 341a to 341c. Further, the outputs of the exclusive OR gates 332a to 332c are applied to the data input terminals of the flip-flops 341a to 341c, respectively.

A total of three bits made up of one-bit output of the flip-flops 341a to 341c provides a chip identifier ID. The three bits forming this chip identifier ID is arranged such that the output of the flip-flop 341a is the least significant bit and the output of the flip-flop 341c is the most significant bit.

When output data Q of the shift register block 310 is "0," the output of the inverter 331 becomes "H" level. In this state, the adder 330 having the above-mentioned circuit configuration operates to output a value obtained by adding 1 to the value of the three-bit chip identifier ID outputted from the chip identifier hold block 340. The flip-flops 341a to 341c receives and holds, for every one period of clock CLK, the outputs of the exclusive OR gates 332a to 332c that are the computed values of this adder 330. Consequently, as described with reference to FIG. 4, the chip identifier ID is incremented for every period of clock CLK.

Then, it is assumed that output data Q of the shift register block 310 become "1," upon which the output of the inverter 331 becomes "L" level. In response, the exclusive OR gates 332a to 332c of the adder 330 operate so as to output the same values as outputted from the flip-flops 341a to 341c. Namely, the adder 330 stops the operation of incrementing the value of chip identifier ID. Consequently, the flip-flops 341a to 341c subsequently continuously hold the same values and output these values. As a result, as shown in FIG. 4, the values of chip identifiers ID1, ID2, and ID3 are set to be fixed at times t1, t2, and t3, respectively. It should be noted that the above-mentioned times t1, t2, and t3 provide the start timings for the output data Q1, Q2, and Q3 of the shift register block 310 to continue "1" (prohibition instruction value).

If the chip identifier setting block 300 takes a configuration corresponding to chip identifier ID of other than three bits, then the chip identifier computation block 320 and the chip identifier hold block 340 may be internally re-configured in accordance with the number of bits of chip identifier ID.

As a specific example, for chip identifier ID having four bits, not shown, four flip-flops 341a to 341d are arranged in the chip identifier hold block 340. In the chip identifier computation block 320, a pair of a AND gate 333d and an exclusive OR gate 332d is added to the configuration shown in FIG. 5. An output of the AND gate 333c and the output of the flip-flop 341c are entered in the AND gate 333d. The outputs of the AND gate 333d and the flip-flop 341d are entered in the exclusive OR gate 332d. The output of the exclusive OR gate 332d is entered in the flip-flop 341d.

As described above and according to the first embodiment of the disclosure, the chip identifier setting blocks 300 in the chip 200 are interconnected in series in the order of laying when automatically setting chip identifiers ID. In this interconnection, the input and the output of the shift register blocks 310 in the chip identifier setting block 300 are interconnected. Therefore, the physical connection is only at one position for joining the upper electrode 211 with the lower electrode 212. Namely, in the first embodiment of the disclosure, the number of inter-layer wires dedicated to the setting of chip identifiers is reduced to one. Consequently, in the case where chips 200 of different constructions are layered, for example, the electrode alignment for each chip 200 for setting a chip identifier can be executed with ease.

For an application of the first embodiment, the chip identifier setting block 300 may also be arranged for the base chip 400 in the configuration shown in FIG. 1, thereby providing a configuration in which the chip identifier setting block 300-4 of the chip 200-4 is connected to the base chip 400. If this configuration is taken, "5" is set as the chip identifier to the chip identifier setting block 300 of the base chip 400. This chip identifier ID as "5" corresponds to the total number of layers in the multilayer semiconductor device 100, namely, the total number of chips that are layered. Therefore, the base chip 400 can recognize the total number of chips including the base chip 400 in the multilayer semiconductor device 100 by the chip identifier ID of the base chip 400. For example, in the multilayer semiconductor device, a redundant chip may be layered that is reserved for the time of a failure of the multilayer semiconductor device 100, namely, not normally used. The value of the chip identifier ID of the base chip 400 thus set can be used for the determination of whether there is a redundant chip or not.

It should be noted that, in the state where chip identifiers ID are eventually set up to the bottom chip identifier setting block 300, then "1" is entered in all the input terminals of the shift register blocks 310 of all layers. Consequently, no current flows across the pullup resistor Rpu of each layer, consuming no power in this port.

(2) Second Embodiment

Exemplary Configuration of a Chip Identifier Setting Block

The following describes the second embodiment of the disclosure. The first embodiment described above provides a basic configuration for assigning consecutive chip identifiers ID in the ascending order from "1" and the shift register block 310 in each chip identifier setting block 300 is a one-bit shift register.

By contrast, in the second embodiment, the shift register block 310 is configured as a multiple-bit shift register of two or more bits. By use of this configuration, chip identifiers ID are set to each chip 200 as with the first embodiment and data indicative of the content of predetermined information associated with the each chip 200 is transmitted to the base chip 400 (refer to FIG. 1). It should be noted that the data indicative of the content of predetermined information associated with each chip 200 is hereafter referred to as chip-associated data.

The above-mentioned chip-associated data includes information indicating such as the function and type of the chip 200, for example. For example, assume that one chip 200 be a memory and another be a DSP (Digital Signal Processor). In response, the above-mentioned chip-associated data includes a value indicative of a memory or a DSP. By holding the chip-associated data that is transmitted as described above, the base chip 400 can recognize the function and type of the chip 200 of each layer.

Figure 6:
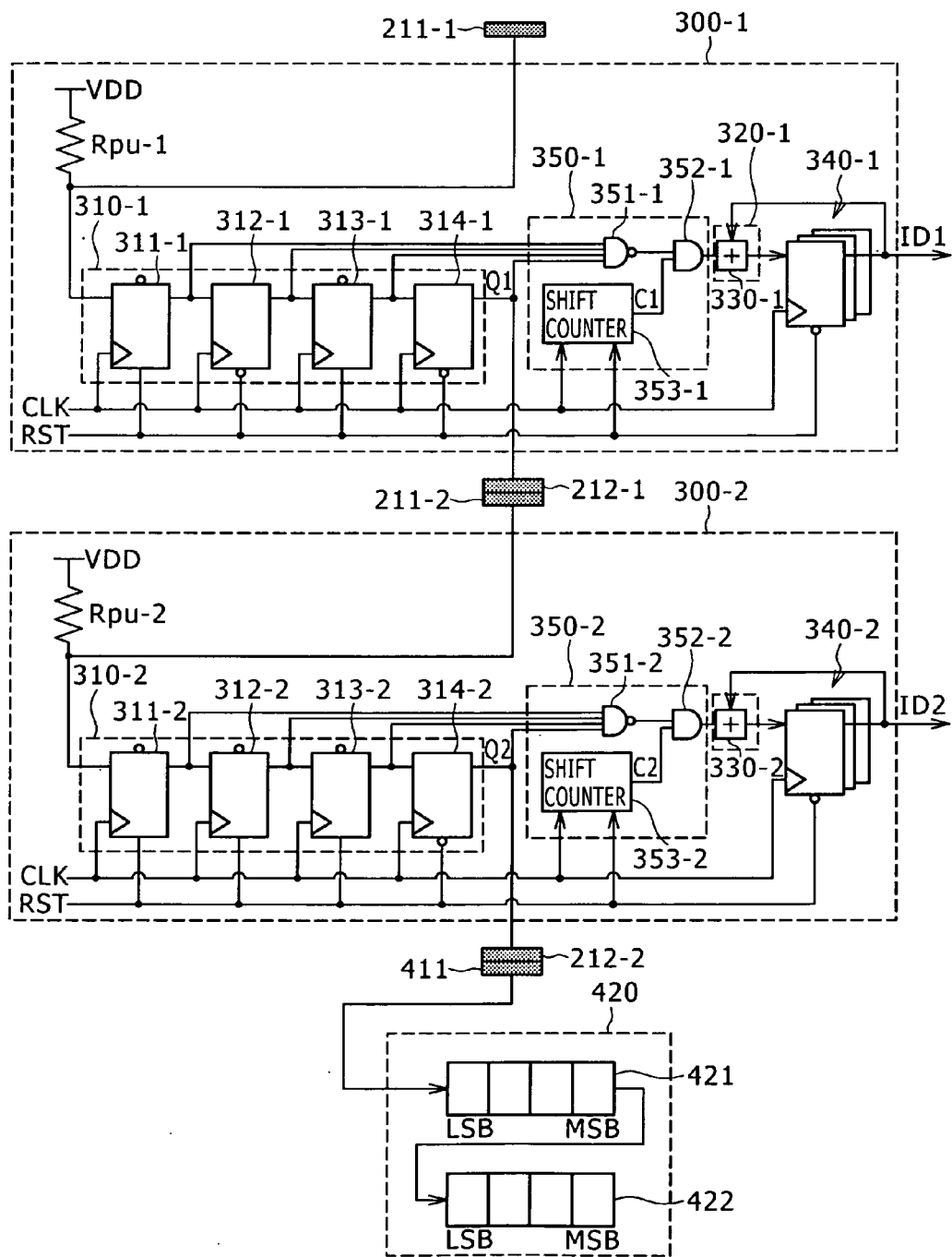
FIG. 6 is a schematic diagram illustrating an chip identifier setting block in a second embodiment of the disclosure.

Referring to FIG. 6, there is shown an exemplary configuration of a chip identifier setting block 300 practiced as the second embodiment of the disclosure. In this figure, it is assumed for the convenience of description that a multilayer semiconductor device 100 be configured by three layers of the chips 200-1, 200-2, and base chip 400. Consequently, FIG. 6 shows a memory 420 as extracted from chip identifier setting blocks 300-1, 300-2, and base chip 400. In addition, referring to FIG. 6, components similar to those previously described with reference to FIG. 3 are denoted by the same reference numerals and the description thereof will be skipped.

The shift register block 310-1 in the chip identifier setting block 300-1 is formed by interconnecting four flip-flops 311-1 to 314-1 in series. Namely, the shift register block 310-1 shown in FIG. 6 is configured as a four-bit shift register. Output data Q1 from the shift register block 310-1 is entered in a shift register block 310-2 of a chip identifier setting block 300-2 of the lower layer via the junction between a lower electrode 212-1 and an upper electrode 211-2. This configuration is the same as that of the first embodiment shown in FIG. 3. The configuration in which the shift register blocks 310-1 and 310-2 are each a four-bit shift register corresponds to the assumption in which the chip-associated data of all layers is four bits.

Further, referring to FIG. 6, a computation control block 350-1 is arranged. The computation control block 350-1 controls a computation operation executed by the chip identifier computation block 320 and has a NAND gate 351-1, an AND gate 352-1, and a shift counter 353-1. The computation control block 350 and the shift register block 310 in the second embodiments are examples of a control block cited in the scope of claims herein.

The NAND gate 351-1 inputs in parallel the outputs of flip-flops 311-1 to 314-1 forming the shift register block 310-1 and outputs a result obtained by executing a NAND operation on these outputs. Namely, the NAND gate 351-1 outputs "H" if at least one of the four parallel outputs is "0" and "L" if all of the four parallel outputs are "1."

In this case, in response to the configuration in which the shift register block 310-1 is formed by a four-bit shift register, the shift counter 353-1 detects a shift timing of every four bits. For every detected timing, count timing signal C1 of "H" pulse is outputted for each detected timing.

The AND gate 352-1 inputs the outputs of the NAND gate 351-1 and the shift counter 353-1 to output a result of an AND operation executed on these outputs.

The adder 330-1 in the second embodiment execute a computation of incrementing chip identifier ID1 when the output of the AND gate 352-1 is "H." If the output of the AND gate 352-1 is "L," the adder 330-1 does not execute the computation, continuously outputting a value of chip identifier ID1 computed last. It should be noted that the adder 330 in the second embodiment may be configured in the same manner as the adder 330 shown in FIG. 5. In this case, the inverter 331 shown in FIG. 5 may be omitted to execute an increment operation in accordance with the output of the AND gate 352-1 that is "H."

The chip identifier setting block 300-2 on the lower layer also has the configuration of the chip identifier setting block 300-1 mentioned above.

A memory 420 in the base chip 400 holds chip-associated data. As shown, this memory 420 can be formed by connecting a first memory block 421 to a second memory block 422 in series. The first memory block 421 and the second memory block 422 each have a storage size of four bits that is the data size of chip-associated data. The first memory block 421 holds the chip-associated data about the chip 200-1 transmitted from the chip identifier setting block 300-1. The second memory block 422 holds the chip-associated data about the chip 200-2 transmitted from the chip identifier setting block 300-2. It should be noted that, in the second embodiment, the base chip 400 having the memory 420 is one example of a storage device cited in the scope of claims herein. The memory 420 having first memory block 421 and the second memory block 422 is one example of a semiconductor device associated data storage block cited in the scope of claims herein.

Figure 7:
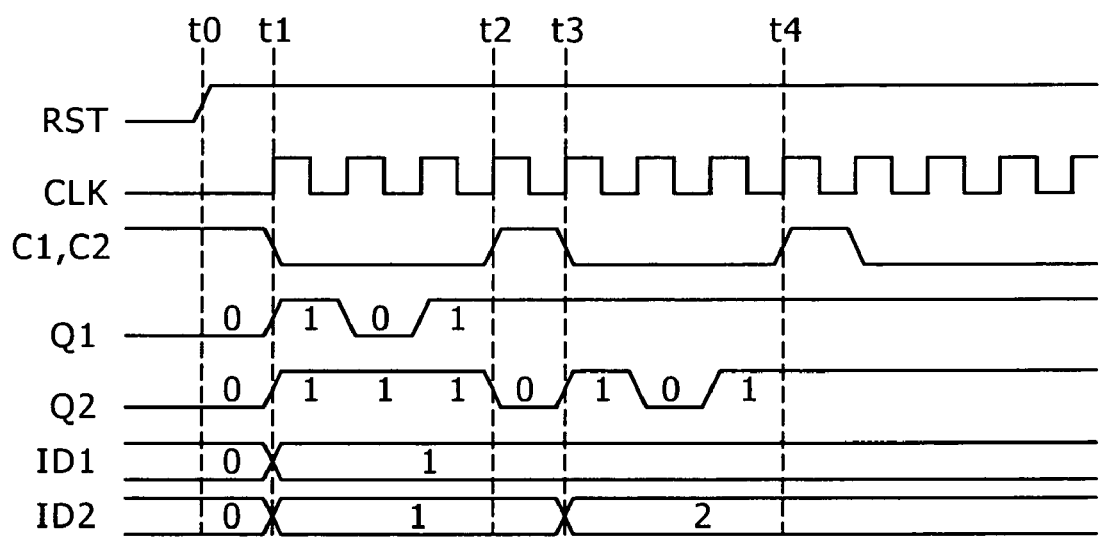
FIG. 7 is a timing chart indicative of an exemplary operation of the chip identifier setting block in the second embodiment of the disclosure.

Exemplary Operations of Chip Identifier Setting and Chip-Associated Data Transmission The following describes a chip identifier ID setting operation by the chip identifier setting blocks 300-1 and 300-2 and a chip-associated data transmission operation shown in FIG. 6 with reference to the timing chart shown in FIG. 7.

First, before time t0 when a reset signal RST is at "L" level, a reset period is provided. In this reset period, the flip-flop 311-1 to 314-1 and flip-flops 311-2 to 314-2 of the shift register blocks 310-1 and 310-2, respectively, are initialized by setting the value of the chip-associated data as an initial value. In this description, it is assumed that the chip-associated data of the chip 200-1 be "0101." In response, values "0," "1," "0," and "1" are set to the flop-flips 314-1, 313-1, 312-1, and 311-1, respectively. As seen from this description, the arrangements of flip-flops 311-1 to 314-1 in this order corresponds to the arrangement of bits from the least significant bit up to the most significant bit of the chip-associated data.

It is also assumed that the chip-associated data of the chip 200-2 is "0111." In response, values of "0," "1," "1," and "1" are set to the flip-flops 314-2, 313-2, 312-2, and 311-2, respectively, of the shift register block 310-1.

Further, in the reset period before time t0, the values of chip identifiers ID1 and ID2 are reset to "0" in the same manner as the first embodiment.

A count timing signal C1 outputted from the shift counter 353-1 and a count timing signal C2 outputted from the shift counter 353-2 become "H" when the reset signal RST is "L." This state continues until the rising edge of clock CLK is entered.

Next, it is assumed that, after the reset state is cleared upon rising of the reset signal RST to "H" at time t0, clock CLK starts at time t1, thereby providing the first rising edge. In response, the count timing signals C1 and C2 of the shift counters 353-1 and 353-2, respectively, fall to "L," subsequently executing an operation of outputting an "H" pulse every four clock CLK rising times. In FIG. 7, the count timing signals C1 and C2 based on the "H" pulse are outputted at time t2 at which the fourth clock CLK from time t1 rises and at time t4 at which the fourth clock CLK from time t2 rises, respectively.

After time t1, the flip-flops 311 to 314 of the shift register blocks 310-1 and 310-2 executes an operation of sequentially shifting the data in response to the rising timing of clock CLK.

Consequently, output data Q1 of the shift register block 310-1 changes from "0" immediately before time t1 to "1," "0," and "1" in this order as shown. Namely, the bit train of the initial value "0101" is first outputted sequentially.

In the input terminal of the shift register block 310-1, namely, the input terminal of the flip-flop 311-1, fixed value "1" is entered by setting the potential of supply voltage VDD via a pullup resistor Rpu-1. Therefore, after the shift-outputting of data of initial values from the flip-flops 311-1 to 314-1 as shown, each of the flip-flops 311-1 to 314-1 becomes in a state where fixed value "1" is held. Consequently, output data Q1 of the shift register block 310-1 is continuously "1" subsequent to time t2 at which the above-mentioned initial values "0101" was outputted.

For output data Q2 of the shift register block 310-2, "0" immediately before time t1, followed by "1," "1," and "1" are outputted in this sequence. To be more specific, initial values "0111" are outputted by four-clock period. In addition, in the shift register block 310-2, output data Q1 of the shift register block 310-1 is sequentially entered. Hence, subsequent to time t2 at which the above-mentioned initial values "011" were outputted, initial values "0101" of the shift register block 310-1 are outputted by the four-clock period. Subsequently, each of the flip-flops 311-2 to 314-2 in the shift register block 310-2 becomes in a state in which fixed value "1" is held, thereby continuously outputting "1" for output data Q2 subsequent to time t4.

In the memory 420 of the base chip 400, values of output data Q2 subsequent to the timing immediately before time t1 are sequentially entered. To be more specific, the bits are entered in the sequence of "01110101." The bits entered in the memory 420 are first entered in the first memory block 421, in which the entered bits are sequentially shifted to be outputted to the second memory block 422.

The first memory block 421 and the second memory block 422 internally shift the entered bits, thereby sequentially storing the bits into bit storage areas each for four bits. Consequently, the second memory block 422 holds initial values "0111" set to the shift register block 310-2. The first memory block 421 holds initial values "0101" set to the shift register block 310-1.

As described above, each piece of chip-associated data of the chips 200-1 and 200-2 is transmitted to the memory 420 of the base chip 400 via the interlayer connections. Then, the chip-associated data of the chip 200-1 is held in the first memory block 421 and the chip-associated data of the chip 200-2 is held in the second memory block 422.

Further, chip identifiers ID are set as follows. Before time t1, each of chip identifier ID1 and ID2 is reset to "0." At this moment, the initial value is entered in the NAND gate 351-1, so that "H" is outputted. The count timing signal C1 of the shift counter 353-1 is also "H" as shown in FIG. 7. Consequently, the adder 330-1 increments the chip identifier ID1 of "0" to output "1." Likewise, in the chip identifier setting block 300-2, the adder 330-2 increments the chip identifier ID2 of "0" to output "1."

As shown in FIG. 7, at the rising edge of clock CLK of time t1, the chip identifier hold blocks 340-1 and 340-2 hold and output "1" outputted from the adders 330-1 and 330-2, respectively. It should be noted that, because the count timing signals C1 and C2 of the shift counters 353-1 and 353-2, respectively, become "L" in the period between time t1 and time t2, the adders 330-1 and 330-2 do not increment the chip identifiers ID1 and ID2.

Now, when time t2 that is the fourth clock from time t1 is reached, the counting timing signals C1 and C2 become "H." However, in the chip identifier setting block 300-1, after time t2, each of the flip-flops 311-1 to 314-1 of the shift register block 310-1 is in the state where "1" is outputted. To be more specific, the values held by the flip-flops 311-1 to 314-1 are fixed to "1111" (prohibition instruction values). In response, the NAND gate 351-1 outputs "L," so that the chip identifier ID1 is not incremented by the adder 330-1. Namely, the updating of the chip identifier ID1 is prohibited. Consequently, after time t2, the chip identifier hold block 340-1 continues holding "1," thereby setting "1" as the chip identifier ID1.

On the other hand, in the chip identifier setting block 300-2 at time t2, a bit train of initial values of the chip identifier setting block 300-1 of the preceding stage is being shifted, so that at least one of the flip-flops 311-2 to 314-2 is outputting "0." Consequently, the AND gate 352-2 outputs "H," so that the adder 330-2 increments the chip identifier ID2 of "1" to output "2" with a timing corresponding to time t2. Next, at time t3 when the next clock CLK rises from time t2, the chip identifier hold block 340-2 holds "2" outputted from the adder 330-2 and outputs this value as the chip identifier ID2.

Next, in a period between time t3 and time t4, the count timing signal C2 of the shift counter 353-2 is "L," so that an increment operation by the adder 330-2 is stopped. Then, at time t4, the count timing signal C2 of the shift counter 353-2 becomes "H." However, subsequent to time t4, the flip-flops 311-2 to 314-2 of the shift register block 310-2 each hold fixed value "1" shifted from the input terminal of the shift register block 310-1. In response, subsequent to time t4, the NAND gate 351-2 also continuously outputs "L," so that the increment of the chip identifier ID2 by the adder 330-2 is stopped, thereby causing the chip identifier hold block 340-2 to hold "2." Thus, "2" is set as the chip identifier ID2.

As seen from the description mentioned above, in the second embodiment of the disclosure, from the upper layer to the lower layer of the layered chip 200, chip identifiers ID can be sequentially set consecutively starting from "1." At the same time, the chip-associated data corresponding to each of the layered chips 200 is sequentially transmitted via the interlayer connections to the lower layers, thereby allowing the base chip 400 at the bottom to hold the transmitted chip-associated data, for example.

The fourth related-art technology described before can only assign consecutive-numbered chip identifiers. By contrast, in the second embodiment of the disclosure, additional information other than chip identifier ID, namely, the chip-associated data, is transmitted to the base chip 400 at the same time chip identifier ID is set as described above. Thus, in the second embodiment of the disclosure, an added value is provided not only that chip identifier ID is set but also that the additional information is transmitted.

(3) Third Embodiment

Exemplary Configuration of the Chip

The following describes the third embodiment of the disclosure. For the chip 200 corresponding to the third embodiment, a chip with a memory block internally installed is assumed, for example. An actual memory block may include a DRAM (Dynamic Random Access Memory), an SRAM (Static Random Access Memory), or a flash memory, for example. It is also assumed that the memory block be formed by one or more memory planes. A memory plane denotes a storage area obtained by logically dividing the memory block. It is also assumed that the size of the memory planes be common to the memory blocks of the chips. It should be noted that the number of memory planes forming a memory block need not be the same between the memory blocks of the chips; that is, different chips 200 may have the different number of memory planes.

In a multiplayer semiconductor device with the chips 200 layered as described above, access is executed by specifying one memory plane in one chip 200, for example. In the case of the multilayer semiconductor device, a signal for this access is transmitted to each chip 200 via interlayer connections, so that it is required to determine whether or riot a specified memory plane is installed in a chip concerned.

In order to satisfy the above-mentioned condition, the third embodiment applies the configuration of the chip identifier setting so far used to the setting of the offset address of each memory plane.

Figure 8:
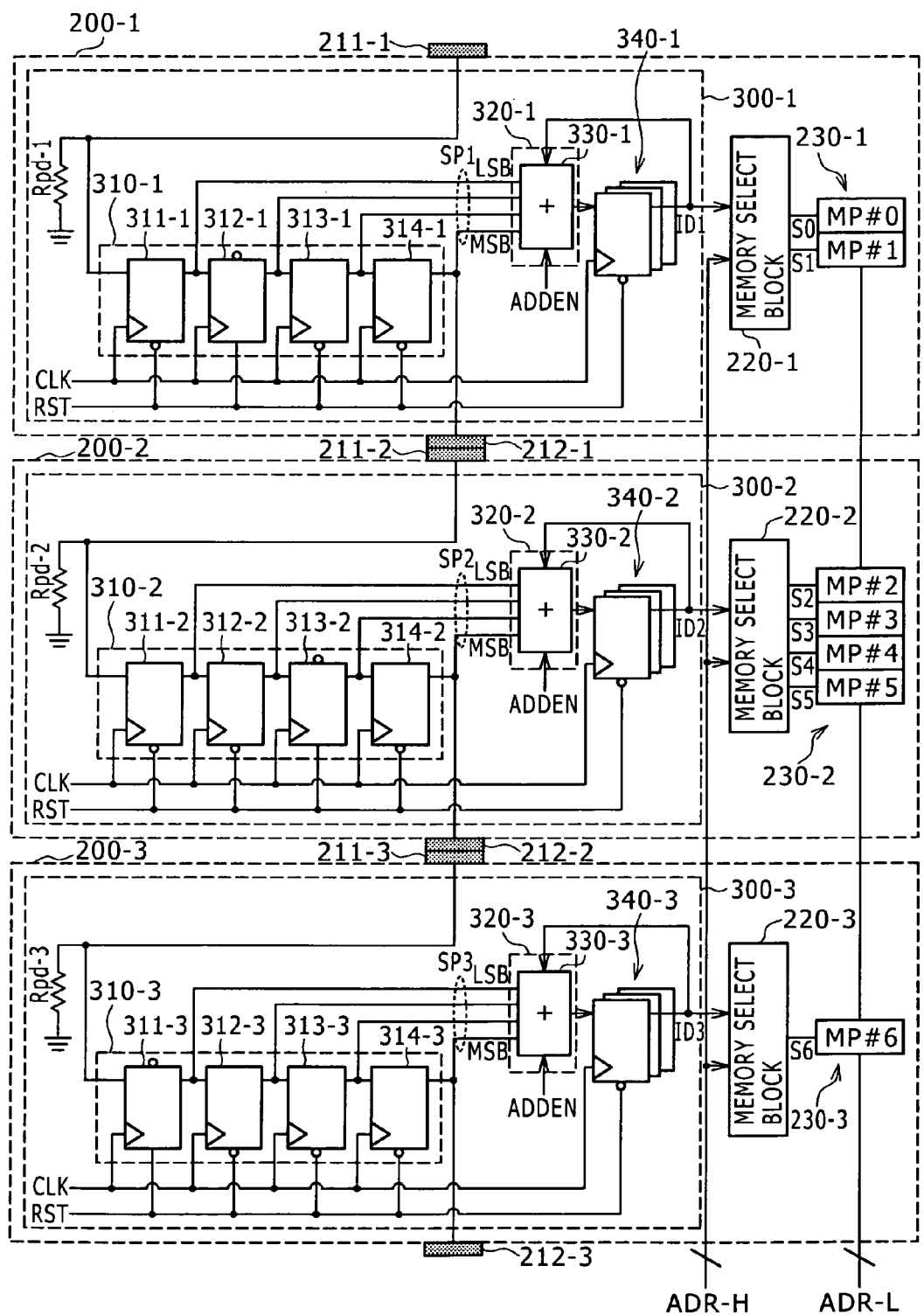
FIG. 8 is a schematic diagram illustrating an exemplary configuration of a chip identifier setting block in a third embodiment of the disclosure.

Referring to FIG. 8, there is exemplary configurations of chips 200-1 to 200-3 each having a chip identifier setting block 300 in the third embodiment. In this example, in a multilayer semiconductor device 100, chips 200-1, 200-2, and 200-3 are arranged from the top layer to the bottom layer in this order. Although not shown, a base chip 400 is arranged below the chip 200-3.

Each of the chips 200-1, 200-2, and 200-3 has the chip identifier setting block 300, a memory select block 220, and a memory block 230.

The memory block 230 stores data and is formed by one or more memory planes (MP). To be more specific, the memory block 230-1 of the chip 200-1 has two memory planes. The memory block 230-2 of the chip 200-2 has four memory planes. The memory block 230-3 of the chip 200-3 has one memory plane. It should be noted that the memory planes of the memory blocks 230 in the chips 200-1, 200-2, and 200-3 have the same storage size.

These memory planes are ascendingly numbered from number 0 in the order from the upper layer of the chips 200 to the lower layer. Therefore, in the memory block 230-1, the two memory planes are assigned with number 0 and number 1. The four memory planes of the memory block 230-2 are assigned with number 2, number 3, number 4, and number 5. Further, one memory plane in the memory block 230-3 is assigned with number 6.

The memory select block 220 inputs chip identifier ID set by the chip identifier setting block 300 and high-order address ADR-H transmitted from the base chip 400 for example, thereby selecting a memory plane specified by this high-order address ADR-H.

It should be noted that the chip identifier ID that is set in the third embodiment is not the identifier of the chip 200 itself but provides an offset address corresponding to each memory plane. However, this offset address is different between the chips 200; therefore, this chip identifier ID is substantially the same as the chip identifiers ID of the first and second embodiments in that the values unique to the layered chips are set.

The memory select block 220-1 outputs memory select signals S0 and S1 to select the memory planes number 0 and number 1, respectively. The memory select block 220-2 outputs memory select signals S2 to S5 to select the memory planes number 2 to number 5. Further, the memory select block 220-3 outputs memory select signal S6 to select the memory plane number 6.

It should be noted that, normally, the specification by the high-order address ADR-H is executed so as to select only one memory plane between the chips 200-1, 200-2, and 200-3. As shown, the high-order address ADR-H is transmitted to the memory select blocks 220-1 to 220-3 over a common signal path via the interlayer connections. Further, the address specification in the selected memory plane is executed by specifying a low-order address ADR-L.

The following describes a configuration of the chip identifier setting block 300 practiced as the third embodiment of the disclosure by use of an example of the chip identifier setting block 300-1 of the chip 200-1. It should be noted that the configurations of the remaining chip identifier setting blocks 300-2 and 300-3 of the chips 200-2 and 200-3 are substantially the same as the configuration of the chip identifier setting block 300-1. In the description of the chip identifier setting block 300-1, components previous described with reference to FIG. 3 and FIG. 6 are denoted by the same reference numerals and the description thereof will be skipped.

In the chip identifier setting block 300-1 shown in FIG. 8, the shift register block 310-1 has four flip-flop 311-1 to 314-1 to be formed as a four-bit shift register. For the convenience of description, it is assumed that the shift register block 310-1 and the chip identifier hold block 340-1 are each configured by the same four bits; however, the shift register block 310-1 and the chip identifier hold block 340-1 may not have the same number of bits. To be more specific, assume that the maximum number of memory planes that can be installed on one chip 200 be "4." Then, in this case, the chip identifier hold block 340-1 may have four bits while the shift register block 310-1 may have three bits. In this case, the chip identifier computation block 320-1 may execute an operation of adding three-bit parallel output SP1 to four-bit chip identifier ID1. However, the shift register blocks 310-1 and 310-3 installed on the other chips 200-2 and 200-3 have to be configured by the same number of bits as those mentioned above.

It should be noted that the arrangement of the flip-flop 311-1 to 314-1 in this order corresponds to the bit string from the least significant bit to the most significant bit. This point is the same as shown in FIG. 6.

In the chip identifier setting block 300-1 shown in FIG. 8, a pulldown resistor Rpd is arranged instead of the pullup resistor Rpu. As shown, the pulldown resistor Rpd is inserted between the input terminal (the input terminal of the flip-flop 311-1) of the shift register block 310-1 and ground. The pulldown resistor Rpd is one example of a fixed-value input block cited in the scope of claims herein.

The adder 330-1 shown in FIG. 8 adds a value indicated by parallel output SP1 of the shift register block 310-1 to chip identifier ID1 when an add enable signal ADDEN becomes "H." It should be noted that the adder 330-1 in this case outputs a computed value in four-bit width. In response, the chip identifier hold block 340-1 is also configured to provide four-bit width by arranging four flip-flops. The chip identifier hold block 340-1 is thus configured to provide four-bit width so as to be compatible with the case in which the high-order address ADR-H is four bits. Namely, in the memory select block 220-1, in order to compare the chip identifier ID1 outputted from the chip identifier hold block 340-1 with the high-order address ADR-H, the chip identifier ID1 and the high-order address ADR-H have to be the same in the number of bits. Hence, in FIG. 8, the chip identifier hold block 340-1 and the chip identifier computation block 320-1 are each configured to output four bits.

Exemplary Chip Identifier Setting Operation

Figure 9:
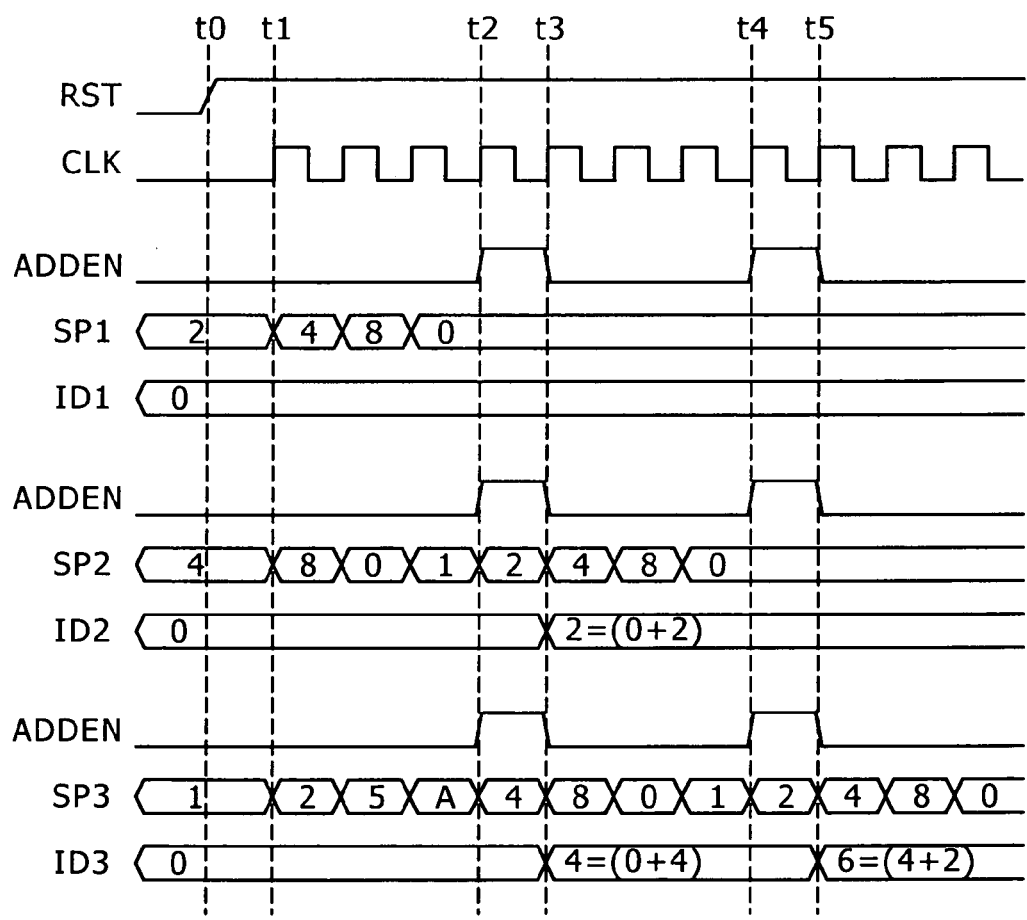
FIG. 9 is a timing chart indicative of an exemplary operation of the chip identifier setting block practiced as the third embodiment of the disclosure.

The following describes an operation of setting chip identifiers ID (memory offset addresses) in the configuration shown in FIG. 8 with reference to the timing chart shown in FIG. 9.

First, in a reset period before time t0 at which a reset signal RST becomes "L," the number of memory planes in the memory block 230-1 of each of the chips 200-1, 200-2, and 200-3 is set as initial values for each of the shift register blocks 310-1 to 310-3. Because the chip 200-1 has two memory planes, "0," "0," "1," and "0" are set to the flip-flops 314-1, 313-1, 312-1, and 311-1, respectively. Because the chip 200-2 has four memory planes, "0," "1," "0," and "0" are set to the flip-flops 314-2, 313-2, 312-2, and 311-2, respectively. Because the chip 200-3 has one memory plane, "0," "0," "0," and "1" are set to the flip-flops 314-3, 313-3, 312-3, and 311-3, respectively. Thus, before time t0, the initial values set to the shift register blocks 310-1 to 310-3 are "2," "4," and "1." As seen from this initial value setting method, the shift register blocks 310 has to each have the number of bits higher than a value to be given as an initial value.

Next, the reset signal RST is inverted to "H" at time t0 and clock CLK is started at time t1, after which the shift register blocks 310-1 to 310-3 shift the bit train. Consequently, the shift register blocks 310-1 to 310-3 after time t1 change from the initial value for every clock period as shown as parallel outputs SP1, SP2, and SP3.

In the shift register block 310-1 in the chip 200-1 on the top layer, "0"s are sequentially entered from the flip-flop 311-1 to the flip-flop 314-1 to be shifted as the data is shifted after time t1. This is because fixed value "0"s are continuously entered in the shift register block 310-1 by fixing the input terminal of the shift register block 310-1 to the ground potential.

Consequently, each of the flip-flop 311-1 to 314-1 of the shift register block 310-1 holds fixed value "0" when the bit train of the initial value is all shifted at time t2 when the fourth clock CLK from time t1 rises. Subsequently, parallel output SP1 of "0" is continued.

In addition, the shift register block 310-2 shifts all the bits of the initial values of the shift register block 310-2 and the shift register block 310-1 until time t4 at which the fourth clock CLK from time t2 rises is reached. Subsequently, each of the flip-flop 311-2 to 314-2 of the shift register block 310-2 holds fixed value "0," thereby continuing parallel output SP2 of "0."

Further, although not shown in FIG. 9, the shift register block 310-3 shifts all the bits of the initial values of the shift register block 310-3 and the shift register blocks 310-2 and 310-1 until the time at which the fourth clock CLK from time t4 rises is reached. Subsequently, "0"s are continuously outputted as parallel output SP3.

As shown, the add enable signal ADDEN is outputted as a pulse that becomes "H" at one timing every four rising edges of clock CLK after the start of the rising of clock CLK at time t1. To be more specific, the add enable signal ADDEN is outputted so as to become "H" for every clock period corresponding to time t2 and time t4 after time t1. The adder 330-1 adds the chip identifier ID1 to the parallel output SP1 with the timings of time t2 and time t4 at which this add enable signal ADDEN becomes "H." At the same time, the adders 330-2 and 330-3 also add the chip identifier ID2 to the parallel output SP2 and the chip identifier ID3 to the parallel output SP3, respectively.

First, at time t2, the adder 330-1 adds the chip identifier ID1 of "0" to the parallel output SP1 of "0" to output "0." Therefore, at time t3 when the clock CLK next to time t2 rises, the chip identifier hold block 340-1 holds "0." This operation is the same as an operation to be executed when the add enable signal ADDEN becomes "H" after time t4. Therefore, after time t3, the chip identifier hold block 340-1 continuously holds "0" and outputs "0" as the chip identifier ID1.

As described above, for the chip 200-1 of the top layer, "0" is set as the chip identifier ID1 indicative of a memory offset address.

At time t2, the adder 330-2 adds the chip identifier ID2 of "0" to the parallel output SP2 of "2" and outputs "2." Time t2 is the rising timing of the fourth clock CLK including time t1. Therefore, this parallel output SP2 of "2" obtained at time t2 is the initial value indicative of the number of memory planes of the memory block 230-1 held in the shift register block 310-1 before time t1.

Then, the chip identifier hold block 340-2 holds "2" at time t3 when the clock CLK next to the above-mentioned time t2 rises and outputs "2" as the chip identifier ID2.

Next, at time t5, the parallel output SP2 is "0." Consequently, at time t5, the adder 330-2 outputs "2" as a result of the addition. It should be noted that, because the parallel output SP2 continues "0" after time t5, the adder 330-2 outputs "2" as an operational result. Consequently, for the chip 200-2, "2" has been set as the chip identifier ID2 indicative of a memory offset address.

Further, at time t2, the adder 330-3 adds the chip identifier ID3 of "0" to the parallel output SP3 of "4" to output "4." This parallel output SP3 of "4" obtained at time t2 is the initial value indicative of the number of memory planes of the memory block 230-2 held in the shift register block 310-2 before time t1. Then, the chip identifier hold block 340-3 holds "4" at time t3 when the clock CLK next to the above-mentioned time t2 rises and outputs "4" as the chip identifier ID3.

Next, at time t5, the parallel output SP3 is "2" that is the initial value indicative of the number of memory planes of the memory block 230-1 set to the shift register block 310-1. Consequently, at time t5, the adder 330-3 outputs "6" as a result of the addition. Although not shown in FIG. 7, when the add enable signal ADDEN becomes "H" next to time t4, the parallel output SP3 also becomes "0," after which this state is continued. Consequently, for the chip 200-3, "6" is set as the chip identifier ID3 indicative of a memory offset address.

As described above, in the configuration shown in FIG. 8, "0" is set for the chip identifier ID1 corresponding to the chip 200-1 of the top layer. In this situation, for the chips 200-2 and 300-3 lower than the chip 200-1, the total number of memory planes of the chips 200 arranged above is set to the chip 200 concerned as the chip identifier ID thereof. To be more specific, as described with reference to FIG. 8, for the chip identifiers ID1, ID2, and ID3 for the chips 200-1, 200-2, and 200-3, "0," "2," and "6" are set, respectively. As seen from FIG. 6, these chip identifiers ID1, ID2, and ID3 match the lowest numbers in the memory planes of the memory blocks 230-1, 230-2, and 230-3 of the chips 200-1, 200-2, and 200-3. Namely, the chip identifiers ID1, ID2 and ID3 are correctly indicative of the offset addresses of the memory planes of the chips 200-1, 200-2, and 200-3, respectively.

Figure 10:
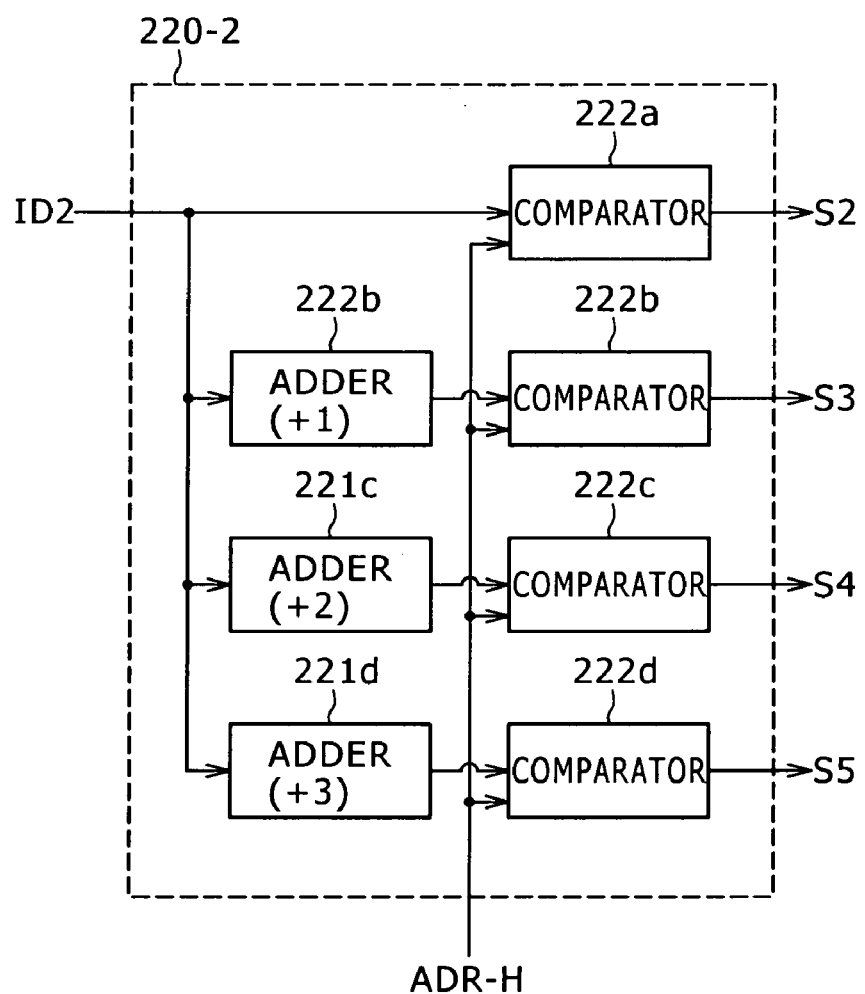
FIG. 10 is a schematic diagram illustrating a memory select block in the third embodiment of the disclosure.

By use of the chip identifier ID set as described above and the high-order address ADR-H, the memory select block 220 selects memory planes as follows, for example. FIG. 10 shows an exemplary configuration of the memory select block 220-2 in the chip 200-2.

The memory select block 220-2 shown in FIG. 10 has four comparators 222a to 222d and three adders 221b to 221d. The chip identifier ID is entered in the comparator 222a and the adders 221b to 221d.

The adder 221b adds "1" to the value of the entered chip identifier ID2 and outputs a resultant value. The adder 221c adds "2" to the value of the entered chip identifier ID2 and outputs a resultant value. The adder 221d adds "3" to the value of the entered chip identifier ID2 and outputs a resultant value.

The comparator 222a compares the chip identifier ID2 with each value of the high-order address ADR-H and, if a match is found, outputs the memory select signal S2 of "H"; if a mismatch is found, the comparator 222a outputs the memory select signal S2 of "L." The comparator 222b compares a value obtained by adding "1" to the chip identifier ID2 with each value of the high-order address ADR-H and, if a match is found, outputs the memory select signal S3 of "H"; if a mismatch is found, the comparator 222b outputs the memory select signal S3 of "L." The comparator 222c compares a value obtained by adding "2" to the chip identifier ID2 with each value of the high-order address ADR-H and, if a match is found, outputs the memory select signal S4 of "H"; if a mismatch is found, the comparator 222c outputs the memory select signal S4 of "L." The comparator 222d compares a value obtained by adding "3" to the chip identifier ID2 with each value of the high-order address ADR-H and, if a match is found, outputs the memory select signal S5 of "H"; if a mismatch is found, the comparator 222d outputs the memory select signal S5 of "L."

For example, assume that the address indicated by the high-order address ADR-H be any one of "2" to "5." Then, any one of the above-mentioned memory select signals S2 to S5 is outputted as "H." One of the memory select signals S2 to S5 gets, when becoming "H," into the state where the corresponding one of the memory planes number 2 to number 5 is selected. If the address indicated by the high-order address ADR-H is other than "2" to "5," the memory select signals S2 to S5 all become "L," selecting none of the memory planes number 2 to number 5.

As described above, by use of the value of the chip identifier ID2 for example, the memory select block 220-2 matches each number of the memory planes of the memory select block 220-2 with the high-order address ADR-H to select a memory plane having the number matching the high-order address ADR-H. With each of the other chips 200, the memory select block 220 is configured by combinations of the comparators 222 and the adders 221 in accordance with the number of memory planes of the chip 200 concerned on the basis of the configuration shown in FIG. 10.

Consequently, when a memory plane of the chip 200-2 is selected by the high-order address ADR-H, the chip 200-2 gets in a state where the specified memory plane is selected. On the other hand, if the high-order address ADR-H is not for the selection of a memory plane of the chip 200-2, then the chip 200-2 can prevent the selection of the memory planes of the chip 200-2.

As described above, in the third embodiment, the chip identifier ID as a memory offset address can be set. This means that any chip identifier ID not based on consecutive numbers can be set for each chip 200. For example, in the fourth related-art technology, nothing but the chip identifiers ID having values sequentially incremented from "0" can be assigned. Thus, in the third embodiment of the disclosure, the degree of freedom higher than the related-art technologies is given in setting the chip identifiers ID.

(4) Fourth Embodiment

Exemplary Configuration of the Chip Identifier Setting Block

As described above, the above-mentioned second embodiment has a configuration in which the setting of chip identifiers ID and transmission of the chip-associated data for each chip 200 to the memory 420 of the base chip 400 are executed. In this configuration, the number of bits of the chip-associated data is four bits for example that is common to all the chips 200 and fixed.

By contrast, assume that the chip-associated data for example be not fixed for all chips but variable for each chip. Namely, the number of bits of the chip-associated data is different from one chip 200 to another. This variable-length arrangement can further increase the degree of freedom, such as the extension of the contents of the chip-associated data for example. Therefore, proposed here is a configuration of a chip identifier setting block 300 as the fourth embodiment of the disclosure in which the chip-associated data having different number of bits for different chips can be transmitted.

Figure 11:
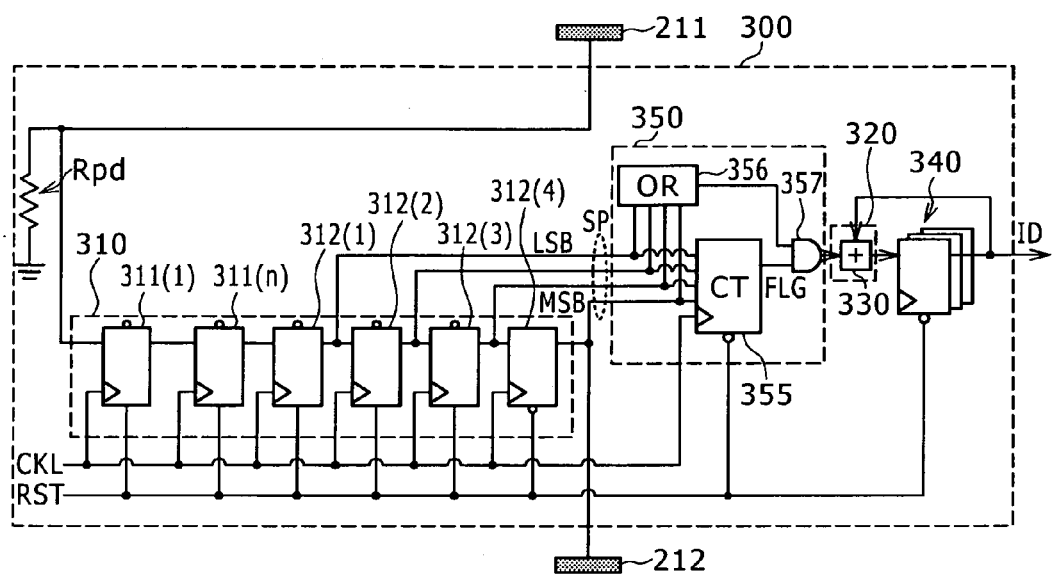
FIG. 11 is a schematic diagram illustrating an exemplary configuration of a chip identifier setting block in a fourth embodiment of the disclosure.

Referring to FIG. 11, there is shown an exemplary configuration of the chip identifier setting block 300 in the fourth embodiment. Referring to FIG. 11, components similar to those previously described with reference to FIG. 6 are denoted by the same reference numerals, and the description thereof will be skipped. First, in a shift register block 310, n flip-flops 311 (1) to (n) are connected in series from the first stage. Following the flip-flop 311 (n), four flip-flops 312 (1) to (4) are connected in series in this case. Namely, the shift register block 310 in FIG. 11 is formed as a shift register of (n+4) bits.

In the above-mentioned configuration, it is assumed that the chip-associated data be made up of a real data part and a data length part in the fourth embodiment. In the shift register block 310 configured as described above, a bit train of the real data part of the chip-associated data is set to the flip-flops 311(1) through 311(n) as initial values. Therefore, the number of flip-flops 311(1) through 311(n) corresponds to the data length (the number of bits) of the real data part of the corresponding chip-associated data. Consequently, the number of flip-flops 311(1) through 311(n) is different between the chips 200 depending upon the number of bits of the real data part.

A bit train for expressing a value indicated by the data length part of the chip-associated data is set to the flip-flops (1) through (4) as initial values. In the example shown in FIG. 11, four flip-flops 312(1) through (4) are arranged and the data length can be expressed by the four bits from the least significant bit to the most significant bit in the order of 312(1) through (4). Namely, in this case, the data length up to 15 bits can be expressed. The value indicative of the data length stored in the data length part is indicative of the data length of the chip-associated data itself. Namely, this data length is a total of the sizes of the real data part and the data length part. To be more specific, if the data lengths of the real data part and the data length part are eight bits and four bits, respectively, then value "12" is stored in the data length part.

It is also assumed that the number of flip-flops 312 here be common to all the chips 200. Namely, the data length part has a fixed length. In the figure, this fixed length is four bits for example. Actually, the number of flip-flops 312 equal to the number of bits necessary for expressing the longest data length of the chip-associated data for all the layered chips 200.

A computation control block 350 has a down counter 355, an OR gate 356, and an AND gate 357. The down counter 355 outputs "H" flag FLG if count value CT held in the down counter 355 is "0." At the same time, the values set to the flip-flops 312(1) through 312(4), namely, parallel output SP, are loaded. Then, these loaded values are down-counted every period of clock CLK.

The OR gate 356 outputs a value obtained by executing an OR operation on the parallel outputs SP of the flip-flop 312(1) through 312(4). Namely, the OR gate 356 outputs "H" if at least one of the values held in the flip-flop 312(1) through 312(4) is "1"; if all held values are "0," the OR gate 356 outputs "L." The AND gate 357 outputs a value obtained by executing an AND operation on the output of the OR gate 356 and the flag FLG.

Figure 12:
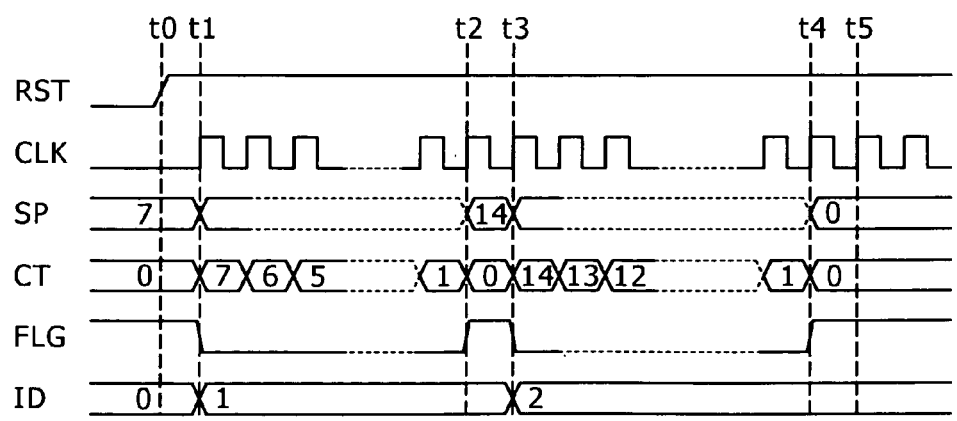
FIG. 12 is a timing chart indicative of an exemplary operation of the chip identifier setting block in the fourth embodiment of the disclosure.

In the fourth embodiment, each layered chip 200 has the chip identifier setting block 300 having the configuration shown in FIG. 11. However, depending on the data length of the chip-associated data corresponding to the chip 200, the number of flip-flops 311(1) through 311(n) of the shift register block 310 is changed. Exemplary operations of chip identifier setting and chip-associated data transmission The following describes exemplary operations of the setting of chip identifiers ID and the transmission of chip-associated data by the chip identifier setting block 300 having the configuration shown in FIG. 11 with reference to the timing chart shown in FIG. 12. It should be noted that the description with reference to FIG. 12 will be made by assuming that the chip identifier setting block 300 shown in FIG. 11 be arranged in the chip 200-2 corresponding to the second layer from top.

First, in a reset period before time t0 in which a reset signal RST is "L," values of the real data part of the chip-associated data corresponding to the chip 200-2 are set to the flip-flops 311(1) through 311(n) in the shift register block 310 as initial values. In addition, to the flip-flops 312(1) through 312(4), values indicated by the data length part are set as initial values.

It is assumed here that the chip-associated data of the chip 200-2 be three bits. Therefore, the shift register block 310 shown in FIG. 11 has three flip-flops 311(1) through 311(3) corresponding to the chip-associated data.

In this case, the values of the data length part to be set to the flip-flops 312(1) through 312(4) are as follows. Namely, "7" obtained by adding three bits that are the data length of the real data part of the chip-associated data corresponding to the chip 200-2 to four bits that are the data length of the data length part is set to the flip-flops 312(1) through 312(4). To be more specific, "0," "1," "1," and "1" are set to the flip-flops 312(4), 312(3), 312(2), and 312(1) in this order, from the most significant bit to the least significant bit. These initial values "0," "1," "1," and "1" are supplied to the down counter 355 as the parallel outputs SP indicative of "7" that expresses the data length.

In the above-mentioned reset period, count value CT of the down counter 355 is initialized to "0." In response, the down counter 355 outputs "H" flag FLG. Also, in the reset period, the values of the data length indicated by the data length part are set to the flip-flops 312(1) through 312(4) as described above, "1" is included in the bit train of the parallel outputs SP. Hence, the OR gate 356 outputs "H" and the AND gate 357 outputs "H."

The adder 330 in this case is configured to output a value obtained by incrementing the chip identifier ID when the AND gate 357 is "H." Further, in the reset period, the chip identifier hold block 340 is initialized so as to hold "0." Therefore, in the reset period, the adder 330 outputs "1" obtained by incrementing the chip identifier ID of "0."

It is assumed that, in the above-mentioned state, the reset signal RST be inverted to "H" after time t0 and clock CLK rise from time t1. Then, the chip identifier hold block 340 holds "1" outputted from the adder 330. Namely, the chip identifier ID changes from "0" to "1" at time t1.

Further, at time t1, the shift register block 310 starts sequentially to shift every clock period a bit train of set initial values and output the shifted values.

Before time t1, the down counter 355 held count value CT of "0," so that the down counter 355 loads, as count value CT, "7" that is the value of the parallel output SP at the rising edge of the clock CLK of time t1. When count value CT other than "0" is held, flag FLG is inverted to "L."

After time t1, the down counter 355 decrements (or down-counts) from loaded "7" every period of clock CLK. Here, as a result of the down-counting of "7," count value CT becomes "0" at time t2.

Thus, when count value CT becomes "0," the initial values of a total of seven bits set to the shift register block 310 in the reset period have just been shifted and outputted. Therefore, the flip-flops 312(1) through 312(4) at this moment hold the values of the data length set as initial values in the shift register block 310 of the chip 200-1 of the top layer. The value of the data length set as the initial value on the side of this chip 200-1 is "14" in this example. That the value of the data length corresponding to the chip 200-1 is "14" means that the real data part of the chip-associated data corresponding to the chip 200-1 is 10 bits. In response, the shift register block 310-1 of the chip 200-1 has 10 flip-flops 311(1) through 311(10) and four flip-flops 312(1) through 312(4), not shown.

Further, at time t2, flag FLG becomes "H" when count value CT becomes "0." At this moment, the parallel output SP is "14" and, in response thereto, the output of the OR gate 356 becomes "H," so that the output of the AND gate 357 also become "H." Consequently, at time t2, the adder 330 increments the chip identifier ID of "1" to output "2."

Then, when time t3 at which the clock CLK next to time t2 is reached, the chip identifier hold block 340 holds "2" outputted from the adder 330 at time t2. Consequently, after time t3, the chip identifier ID becomes "2."

After time t3, the down counter 355 loads the parallel output SP of "14" to execute down-counting. In the figure, as a result of decrement from "14," the count value CT is "0" at time t4. At time t4, the shift register block 310 has shift-outputted the bit train of a total of 14 bits of the real data part (10 bits) and the data length part (four bits) set as the initial values to the chip 200-1 of the top layer.

In the above-mentioned state, the flip-flops 311(1) through 311(3) and the flip-flops 312(1) through 312(4) of the shift register block 310 all hold "0." This "0" held here was obtained by shifting the fixed value entered in the shift register block 310-1 through the pulldown resistor Rpd in the chip 200-1 of the top layer. Thus, after time t4, the flip-flops 311(1) through 311(3) and flip-flops 312(1) through 312(4) of the shift register block 310 continue the state in which "0" is held. Hence, the flip-flop 312(1) through 312(4) continue the output of the parallel output SP of "0."

Consequently, flag FLG becomes "H" at time t4 but the OR gate 356 becomes "L" and "L" is outputted from the AND gate 357. In response, the adder 330 does not execute an operation of incrementing the chip identifier ID, so that the adder 330 outputs "2" that is the same as before time t4. Consequently, at time t5 when the clock CLK next to time t4 rises, the chip identifier hold block 340 holds "2" that is the same as before. As described above, because the parallel output SP continues "0" after time t4, the increment by the adder 330 is not subsequently executed, so that "2" continues for the chip identifier ID after time t5. Thus, "2" is set as the chip identifier ID.

It should be noted that, at time t4, the down counter 355 loads the parallel output SP of "0." Therefore, the down counter 355 does not subsequently execute down counting, continuously holding the count value CT of "0," continuing the output of flag FLG of "H."

The operation of the chip identifier setting block 300 as described above is executed for each layered chip 200, thereby setting the consecutive chip identifiers in the ascending order from "1" for the chips 200 from the top layer to the bottom layer.

Example of Data Decoding in the Base Chip

Further, the execution of the operation described above with reference to FIG. 12 finally causes the chip-associated data set to the shift register block 310 of each chip 200 from the top layer to the bottom layer as the initial value to be transmitted to and held in the base chip 400.

Figure 13:
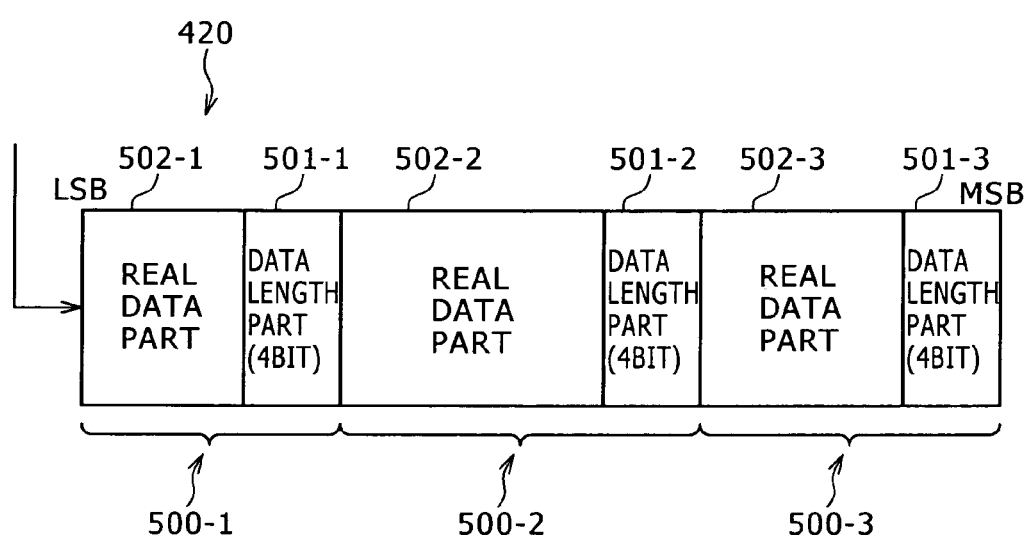
FIG. 13 is a schematic diagram illustrating chip-related data held in a memory in the fourth embodiment of the disclosure.

Referring to FIG. 13, there is shown an example of the chip-associated data held in the memory 420 of the base chip 400. It should be noted that this figure assumes a multilayer semiconductor device 100 in which chips 200-1 through 200-3 are layered from top to bottom, which are laid on the base chip 400.

In the memory 420 shown in FIG. 13, chip-associated data 500-1 through 500-3 corresponding to the chips 200-1 through 200-3, respectively, are stored. Each of the chip-associated data 500 is formed by the bits of a data length part 501 and a real data part 502 from the high-order bit to the low-order bit.

When the operation described above with reference to FIG. 12 is being executed, the chip-associated data 500-3, 500-2, and 500-1 are entered and held in the memory 420 from the most significant bit to the least significant bit. Consequently, in the memory 420, the data length part 501 and the real data part 502 of the chip-associated data 500-3 through 500-1 are sequentially stored from the most significant bit to the least significant bit as shown in FIG. 13. It should be noted that, according to the description of FIG. 11, the number of bits of the data length part 501 is a total of the number of bits of the corresponding real data part 502 and the number of bits of the data length part 501. Namely, the data length part 501 is indicative of the data length of the corresponding chip-associated data 500.

Thus, from the memory 420 in which the chip-associated data 500 is stored, the base chip 400 extracts the real data part 502 of the desired chip 200 as described below. In order to execute this extraction, the base chip 400 first recognizes the data length indicated by the data length part 501-3 arranged from the beginning (the most significant bit) of the memory 420. It should be noted that, in the fourth embodiment, it is specified that the data length part 501 has the fixed length of four bits, which is known by the base chip 400.

Then, obtaining the bit position corresponding to the recognized data length from the beginning of the memory 420 allows the recognition of the end position of the chip-associated data 500-3 and the start position of the chip-associated data 500-2. Next, the data length part 501-2 arranged from the start position of the chip-associated data is referenced to recognize the data length part of the chip-associated data 500-2. On the basis of this recognition, the end position of the chip-associated data 500-2 and the start position of the chip-associated data 500-1 are recognized. Then, the data length part 501-1 arranged from the start position of the chip-associated data 500-1 is referenced to recognize the end position of the chip-associated data 500-1.

After the recognition of the boundary positions between chip-associated data as described above, a desired real data part 502 can be extracted as described below. In order to extract the real data part 502-2 for example, a bit position obtained by shifting from the start position of the chip-associated data 500-2 down by four bits corresponding to the data length part 501-2 is accessed. Then, the data arranged from this bit position to the end position of the chip-associated data 500-2 may be read.

As described above, according to the fourth embodiment of the disclosure, the chip-associated data 500 having different lengths for the different chips 200 can be stored in the base chip 400 and a desired real data part 502 can be selectively processed in the base chip 400.

It should be noted that, in each of the above-mentioned embodiments, the shift register block 310 captures signals transmitted from the chip 200 of the higher layer and shifts the captured signals, transmitting the shifted signals to the chip 200 of the lower layer. However, this configuration may be reversed such that signals are transmitted from the chip of the lower layer to the chip of the higher layer, thereby setting the chip identifiers in the ascending order from bottom to top. In each of the above mentioned embodiment, the chip identifier computation block 320 is configured to compute new values by addition; conversely, the chip identifier computation block 320 may be configured to compute new values by subtraction relative to a certain initial value.

In each of the above-mentioned embodiments, a pair of the chip identifier setting blocks 300 connected between the chips 200 is one pair; however, two or more pairs may be provided. For example, two pairs may be arranged; a pair of the chip identifier setting blocks 300 corresponding to any one of the first, second, and fourth embodiments and a pair of the chip identifier setting blocks 300 corresponding to the third embodiment. This multiple-pair configuration allows the simultaneous setting of chip identifiers ID (and the transmission of chip-associated data) and the setting of memory offset addresses. As seen from the description made above, the chip identifier ID in the embodiments of the disclosure is not limited to a general identifier for individually identifying each chip 200. To be more specific, as represented by the memory offset address in the third embodiment, a value having a predetermined significance having a correlation for each chip 200 is handled as a chip identifier ID. The setting of chip identifiers ID in the embodiments of the disclosure has a higher degree of freedom in this point than that of related-art technologies. Obviously, like the first, second, and fourth embodiments, the setting of chip identifiers ID consecutively throughout the chips 200 can also be achieved with ease.

The embodiments of the disclosure described above are only examples for embodying the disclosure. As explicitly described in each of the embodiments of the disclosure, there is the correlation between the items in the embodiments of the disclosure and the disclosure specific items in the scope of claims herein. Likewise, there is the correlation between the disclosure specific items in the scope of claims herein and the items in the embodiments of the disclosure having the same names as the disclosure specific items. While preferred embodiments of the present disclosure have been described using specific terms, such description is for illustrative purpose only, and it is to be understood that changes and variations may be made without departing from the spirit or scope of the following claims.

The present disclosure contains subject matter related to that disclosed in Japanese Priority Patent Application JP 2010-170815 filed in the Japan Patent Office on Jul. 29, 2010, the entire content of which is hereby incorporated by reference.

What is claimed is:

1. A semiconductor device comprising:
    an input terminal configured, if a preceding-stage semiconductor device is layered on a predetermined one of an upper layer and a lower layer, to receive a bit train outputted from said preceding-stage semiconductor device;
    a chip identifier hold block configured to hold a chip identifier for uniquely identifying said semiconductor device;
    a chip identifier computation block configured to execute computation by use of said chip identifier to update said chip identifier held in said chip identifier hold block in accordance with a result of the computation;
    a control block configured to once hold data of a bit train entered from said input terminal to control updating of said chip identifier executed by said chip identifier computation block on the basis of said held data; and
    an output terminal configured to output said bit train held in said control block to a succeeding-stage semiconductor device layered on another layer.

2. The semiconductor device according to claim 1, wherein said control block controls the execution of the updating of said chip identifier in accordance with said held data.

3. The semiconductor device according to claim 2, wherein, if a value of said held data is a predetermined prohibition instruction value, then said control block prohibits the updating of said chip identifier and, if a value of said held data is not said predetermined prohibition instruction value, then allows the updating of said chip identifier.

4. The semiconductor device according to claim 1, wherein said control block holds and sequentially shifts a bit train of semiconductor device associated data indicating predetermined contents of information associated with a semiconductor device in which said information is entered and executes the updating of said chip identifier in accordance with a timing at which said held semiconductor device associated data have all been shifted out.

5. The semiconductor device according to claim 4, wherein said control block executes the updating of said chip identifier in accordance with a timing at which a shift count according to a bit length of said semiconductor device associated data based on a fixed length has been counted.

6. The semiconductor device according to claim 4, wherein said semiconductor device associated data is made up of a real data part based on a given data length and a data length part based on a fixed length, and
    said control block executes the updating of said semiconductor identifier in accordance with a timing at which a bit train having a bit length indicated by said held data length part has been shifted out.

7. The semiconductor device according to claim 1, wherein said control block executes the updating of said chip identifier in accordance with said computation result obtained by adding a constant value to said chip identifier.

8. The semiconductor device according to claim 1, wherein said control block executes the updating of said chip identifier in accordance with said computation result obtained by use of said held data and said chip identifier.

9. The semiconductor device according to claim 8, wherein said control block gets addition value data to be added to said chip identifier from said input terminal to hold the obtained addition value data and executes the updating of said chip identifier in accordance with said computation result obtained by adding a value of said held addition value data to said chip identifier.

10. The semiconductor device according to claim 9, wherein the value of said addition value data indicates the number of storage blocks of a corresponding semiconductor device.

11. The semiconductor device according to claim 3, further comprising:
    a fixed value input block through which bits based on a fixed value are entered into said control block if no bit train is entered from said input terminal, said prohibition instruction value being a value obtained when each bit of said held data is said fixed value.

12. The semiconductor device according to claim 11, wherein said fixed value input block is a pullup resistor inserted between a signal line based on positive supply voltage and an input of said control block.

13. The semiconductor device according to claim 11, wherein said fixed value input block is a pulldown resistor inserted between ground signal line and an input of said control block.

14. A multilayer semiconductor device comprising:
a plurality of layered semiconductor devices; and
a storage device that is layered on said plurality of layered semiconductor devices;
wherein each of said plurality of layered semiconductor devices has
  an input terminal configured, by being connected to an output terminal of another semiconductor device layered on one of an upper layer and a lower layer, to receive a bit train outputted from said connected output terminal,
  a chip identifier hold block configured to hold a chip identifier for uniquely identifying said semiconductor device,
  a chip identifier computation block configured to execute computation by use of said chip identifier to update said chip identifier held in said chip identifier hold block in accordance with a result of the computation,
  a control block configured to once hold data of a bit train inputted from said input terminal to control the updating of said chip identifier executed by said chip identifier computation block on the basis of said held data, said controlling block receiving a bit train of semiconductor device associated data indicative of contents of predetermined information associated with a semiconductor device from said input terminal, and
  an output terminal configured, by being connected to an input terminal of still another semiconductor device layered on another layer, to output a bit train held in said control block to said connected input terminal, and
said storage device has a semiconductor device associated data storage block configured to receive a bit train outputted from said output terminal of a final stage semiconductor device in said layered semiconductor device to store semiconductor device associated data in said received bit train.

15. A multilayer semiconductor device comprising:
a plurality of layered semiconductor devices;
wherein each of said plurality of semiconductor devices has
  an input terminal configured, by being connected to an output terminal of another semiconductor device layered on one of an upper layer and a lower layer, to receive a bit train outputted from said connected output terminal,
  a chip identifier hold block configured to hold a chip identifier for uniquely identifying said semiconductor device,
  a chip identifier computation block configured to execute computation by use of said chip identifier to update said chip identifier held in said chip identifier hold block in accordance with a result of the computation,
  a control block configured to once hold data of a bit train inputted from said input terminal to control the updating of said chip identifier executed by said chip identifier computation block on the basis of said held data and hold semiconductor device associated data indicating contents of predetermined information associated with a semiconductor device as an initial value, and
  an output terminal configured, by being connected to an input terminal of another semiconductor device layered on another layer, to output a bit train held in said control block to said connected input terminal.

\* \* \* \* \*